(12) United States Patent
Dewey et al.

(10) Patent No.: US 10,770,593 B2
(45) Date of Patent: Sep. 8, 2020

(54) BEADED FIN TRANSISTOR

(71) Applicant: INTEL CORPORATION, Santa Clara, CA (US)

(72) Inventors: Gilbert Dewey, Beaverton, OR (US); Tahir Ghani, Portland, OR (US); Willy Rachmady, Beaverton, OR (US); Jack T. Kavalieros, Portland, OR (US); Matthew V. Metz, Portland, OR (US); Anand S. Murthy, Portland, OR (US); Chandra S. Mohapatra, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 16/081,572

(22) PCT Filed: Apr. 1, 2016

(86) PCT No.: PCT/US2016/025605
§ 371 (c)(1),
(2) Date: Aug. 31, 2018

(87) PCT Pub. No.: WO2017/171845
PCT Pub. Date: Oct. 5, 2017

(65) Prior Publication Data
US 2019/0097055 A1    Mar. 28, 2019

(51) Int. Cl.
*H01L 29/78*    (2006.01)
*H01L 29/66*    (2006.01)
(Continued)

(52) U.S. Cl.
CPC .. *H01L 29/7853* (2013.01); *H01L 21/823807* (2013.01); *H01L 21/823821* (2013.01);
(Continued)

(58) Field of Classification Search
CPC combination set(s) only.
See application file for complete search history.

(56) References Cited

U.S. PATENT DOCUMENTS 9,219,154 B1    12/2015 Cheng et al.
2007/0231997 A1*  10/2007 Doyle ............... H01L 29/66818
                                                        438/253
(Continued)

FOREIGN PATENT DOCUMENTS

WO    2017/171845 A1    10/2017

OTHER PUBLICATIONS

International Search Report and Written Opinion received for PCT Application No. PCT/US2016/025605, dated Dec. 8, 2016. 14 pages.

(Continued)

*Primary Examiner* — Ratisha Mehta
(74) *Attorney, Agent, or Firm* — Finch & Maloney PLLC

(57) ABSTRACT

Techniques are disclosed for forming a beaded fin transistor. As will be apparent in light of this disclosure, a transistor including a beaded fin configuration may be formed by starting with a multilayer finned structure, and then selectively etching one or more of the layers to form at least one necked (or relatively narrower) portion, thereby forming a beaded fin structure. The beaded fin transistor configuration has improved gate control over a finned transistor configuration having the same top down area or footprint, because the necked/narrower portions increase gate surface area as compared to a non-necked finned structure, such as finned structures used in finFET devices. Further, because the beaded fin structure remains intact (e.g., as compared to a gate-all-around (GAA) transistor configuration where nanowires are separated from each other), the parasitic (Continued)

capacitance problems caused by GAA transistor configurations are mitigated or eliminated.

20 Claims, 8 Drawing Sheets

(51) Int. Cl.
    *H01L 21/8238*     (2006.01)
    *H01L 29/08*     (2006.01)
    *H01L 29/10*     (2006.01)
    *H01L 29/423*     (2006.01)

(52) U.S. Cl.
    CPC ............ *H01L 21/823828* (2013.01); *H01L 21/823864* (2013.01); *H01L 21/823878* (2013.01); *H01L 29/0847* (2013.01); *H01L 29/1054* (2013.01); *H01L 29/4236* (2013.01); *H01L 29/6656* (2013.01); *H01L 29/6681* (2013.01); *H01L 29/66545* (2013.01); *H01L 29/66818* (2013.01)

(56) References Cited

U.S. PATENT DOCUMENTS

| | | | |
|---|---|---|---|
| 2011/0147811 A1* | 6/2011 | Kavalieros | H01L 29/66795 257/288 |
| 2014/0252478 A1 | 9/2014 | Doornbos et al. | |
| 2015/0194528 A1* | 7/2015 | Okano | H01L 29/42392 257/401 |
| 2015/0364594 A1* | 12/2015 | Mieno | H01L 27/14692 257/401 |
| 2015/0364603 A1* | 12/2015 | Cheng | H01L 29/6681 257/192 |
| 2016/0071933 A1* | 3/2016 | Maitrejean | H01L 29/1054 257/401 |

OTHER PUBLICATIONS

International Preliminary Report on Patentability received for PCT Application No. PCT/US2016/025605, dated Oct. 2, 2018. 10 pages.

\* cited by examiner

BEADED FIN TRANSISTOR

BACKGROUND

Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain, for example. Some FETs have a fourth terminal called, the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include sidewall or so-called gate spacers on either side of the gate that can help determine the channel length and can help with replacement gate processes, for example. Complementary MOS (CMOS) devices typically use a combination of p-type MOSFETs (p-MOS) and n-type MOSFETs (n-MOS) to implement logic gates and other digital circuits.

BRIEF DESCRIPTION OF THE DRAWINGS

FIGS. 3A-D (provided in conjunction with FIG. 3) illustrate example alternative fin trench bottom shapes that may be formed during the method configured to form transistors including beaded fin configurations, in accordance with some embodiments of this disclosure.

Figure 1:
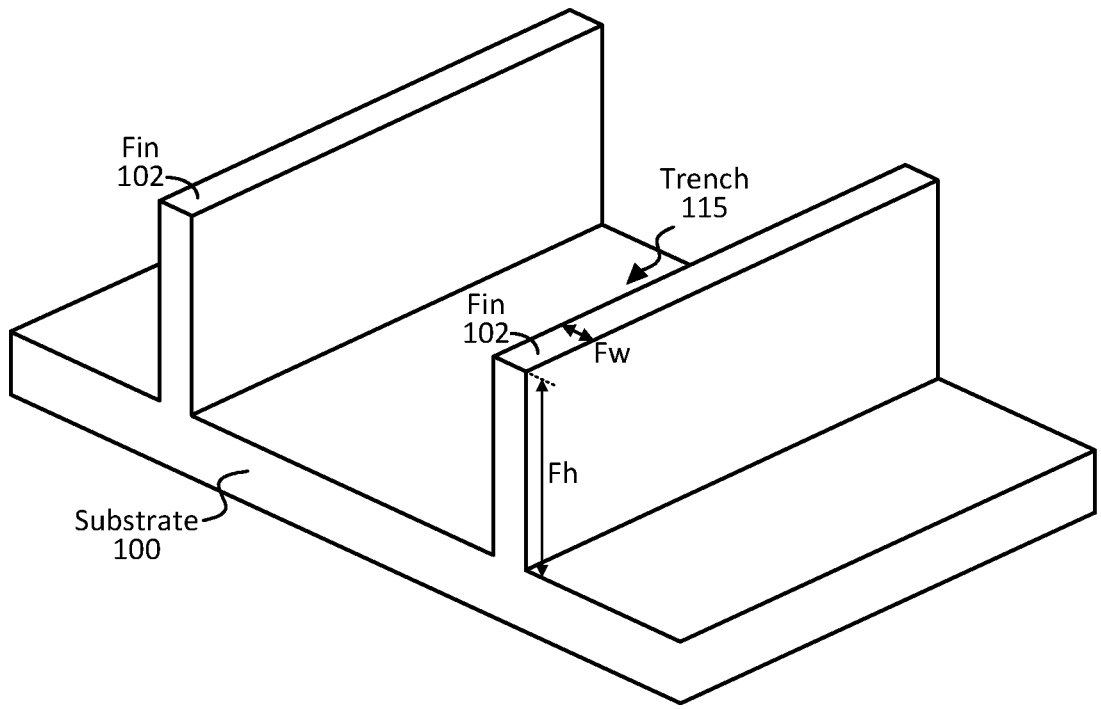
FIGS. 1-12 illustrate example integrated circuit structures resulting from a method configured to form transistors including beaded fin configurations, in accordance with some embodiments of this disclosure. Note that FIGS. 1-8 and 12 illustrate isometric views of the integrated circuit structure. Also note that FIGS. 9-11 illustrate cross-sectional planar views along plane A-A indicated in FIG. 8.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming a beaded fin transistor. As will be apparent in light of this disclosure, a transistor including a beaded fin configuration may be formed by starting with a multilayer finned structure, and then selectively etching one or more of the layers to form at least one necked (or relatively narrower) portion, thereby forming a beaded fin structure. In some embodiments, the multilayer finned structure may include alternating layers of two different materials, such that when the selective etch is performed, every other layer may be narrowed to form the beaded fin structure. The beaded fin transistor configuration has improved gate control over a finned transistor configuration having the same top down area or footprint, because the necked/narrower portions increase gate surface area as compared to a non-necked finned structure, as will be apparent in light of this disclosure. Further, the necked portions of the beaded fin configuration are more easily depleted of charge and may have increased quantization (e.g., due to quantum confinement) as a result of the portions being narrower. Further still, because the beaded fin structure remains intact (e.g., as compared to a gate-all-around (GAA) transistor configuration where nanowires are separated from each other to allow the gate to wrap around each nanowire), the parasitic capacitance problems caused by GAA transistor configurations are mitigated or eliminated. Numerous configurations and variations will be apparent in light of this disclosure.

General Overview

For continued transistor gate length scaling, maintaining gate control is an important factor. Finned transistor configurations, such as 3D finFETs, include a finned structure in the transistor channel region whereby the conductive channel of the device resides on the outer portions of the fin, adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along three different, outer, planar regions of the fin, such a finned design is sometimes referred to as a tri-gate transistor. Another non-planar transistor configuration is a gate-all-around (GAA) configuration, which is configured similarly to a finned transistor, but instead of a finned channel region where the gate is on three portions (and thus, there are three effective gates), one or more nanowires (or nanoribbons) are used and the gate material generally surrounds each nanowire. Finned and GAA transistor configurations are two approaches that have been taken to address maintaining suitable gate control with continued gate length scaling. However, each configuration has its limitations. For example, GAA transistor configurations have better gate control than finned configurations. However, employing GAA configurations introduces process complexity and parasitic capacitance challenges, such as parasitic capacitance caused by the spaces between each nanowire and other nanowires and/or the sub-fin.

Thus, and in accordance with one or more embodiments of this disclosure, techniques are provided for forming a beaded fin transistor. In some embodiments, a transistor including a beaded fin configuration can be formed by starting with a multilayer finned structure, and then selectively etching one or more of the layers to form at least one necked (or narrower) portion, thereby forming a beaded fin structure. In some such embodiments, the beaded fin transistor configuration has improved gate control over a finned transistor configuration having the same top down area or footprint, because the necked (or narrower) portions increase gate surface area as compared to a non-necked finned structure, as will be apparent in light of this disclosure. Further, in some such embodiments, the necked portions of the beaded fin configuration are more easily depleted of charge and may have increased quantization (e.g., due to quantum confinement) as a result of the portions being narrower. Further still, in some such embodiments, because the beaded fin structure remains intact (e.g., as compared to a GAA configuration where nanowires are separated from each other to allow the gate to wrap around each nanowire), the parasitic capacitance problems caused by GAA transistor configurations are eliminated or mitigated. In some embodiments, a field-effect transistor (FET) including a beaded fin channel configuration may be referred to as a beaded finFET, for example.

As will be apparent in light of this disclosure, the techniques can be used to form transistors having a beaded fin channel configuration including various suitable semiconductor materials. For example, in some embodiments, the beaded fin structures may include group IV semiconductor material, such as silicon (Si), germanium (Ge), and/or SiGe, to name some examples. In some embodiments, the beaded fin structures may include group III-V semiconductor material, such as indium gallium arsenide (InGaAs), indium phosphide (InP), indium arsenide (InAs), indium antimonide (InSb), indium aluminum arsenide (InAlAs), gallium antimonide (GaSb), indium arsenide antimonide (InAsSb), gallium arsenide (GaAs), and/or gallium phosphide (GaP), to name some examples. In the context of III-V materials, super lattice heterojunctions are capable of being strained. However, different III-V material systems typically have lattice mismatch. Thus, in some embodiments, if the layers of the beaded fin structure are kept thin enough in a vertical dimension (e.g., the dimension of the main axis of the stack of layers) to be below the critical thickness (above which the film relaxes and defects form), then III-V layers of dissimilar lattice constants can be incorporated in the beaded fin without defects forming between the layers. This allows strain to be maintained in the structure despite the lattice mismatch between the layers. This also allows for a wider selection of lattice constant materials than could be selected in finned or GAA transistor configurations, for example. In some embodiments, such as embodiments where III-V material is grown on a group IV substrate (e.g., a Si substrate), an aspect ratio trapping (ART) scheme may be used to address any defects that may occur and to cause such defects to terminate at non-crystalline (e.g., dielectric) sidewalls, as will be apparent in light of this disclosure. In some such embodiments, a buffer layer may be used to address any such defects, where the buffer layer (or at least a portion of the buffer layer) is not in the active channel region portion. As can be understood based on this disclosure, both group IV and III-V semiconductor material systems can be selectively etched relative to materials in their own group and materials in the other group, which enables beaded fin structures as described herein. For example, some III-V material pairings have large relative etch selectivities of greater than 100 to 1, which may help with the formation of the beaded fin structures described herein, in accordance with some embodiments.

As previously described, in some embodiments, III-V materials may be used in a beaded fin transistor channel configuration, and III-V materials have various bandgap, effective mass, and carrier mobility properties that can allow for different target applications to be achieved. For instance, lower bandgap III-V materials generally have a smaller effective mass and higher mobility, but such materials typically have issues with achieving the level of gate control and low off-state current (Ioff) desired in a high performance logic transistor. However, in some embodiments, in the beaded fin structure, lower bandgap material may be selected for the necked/narrowed layers of the beaded fin, which can allow for better gate control and more quantization (e.g., due to quantum confinement) in those necked/narrower sections of the beaded fin. In addition, such embodiments may take advantage of the lower bandgap materials (which generally include high mobility and injection velocity) while at the same time granting more gate control than otherwise possible in a finned transistor configuration (e.g., as a result of the increased gate stack surface area in the necked/narrowed portions). In some embodiments, a higher threshold voltage (Vt) or lower Ioff leakage may be desired for transistor performance, such that III-V materials with higher bandgaps may be selected for the necked/narrowed layers of the beaded fin configuration. Numerous material and structural variations and configurations will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); x-ray photoelectron spectroscopy (XPS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a transistor device including a beaded fin channel configuration as described herein. For example, in some embodiments, such structures may include a beaded fin structure below and adjacent to a transistor gate stack (which may include a gate dielectric layer and a gate electrode, for example). Further, such a transistor beaded fin channel configuration may be identified by first identifying a structure including the structure using cross-sectional analysis (e.g., using SEM, TEM, or STEM through a transistor) and then performing analysis for composition of material on the structural layers (e.g., using composition mapping) to identify the different materials of the beaded fin structure, for example. In some embodiments, the beaded fin transistors described herein may be detected, for instance, by measuring the benefits achieved from using such a configuration, such as the improvement in gate control, carrier mobility, Vt, and/or Ioff leakage, to name some benefits. Numerous configurations and variations will be apparent in light of this disclosure.

Methodology and Architecture

Figure 7:
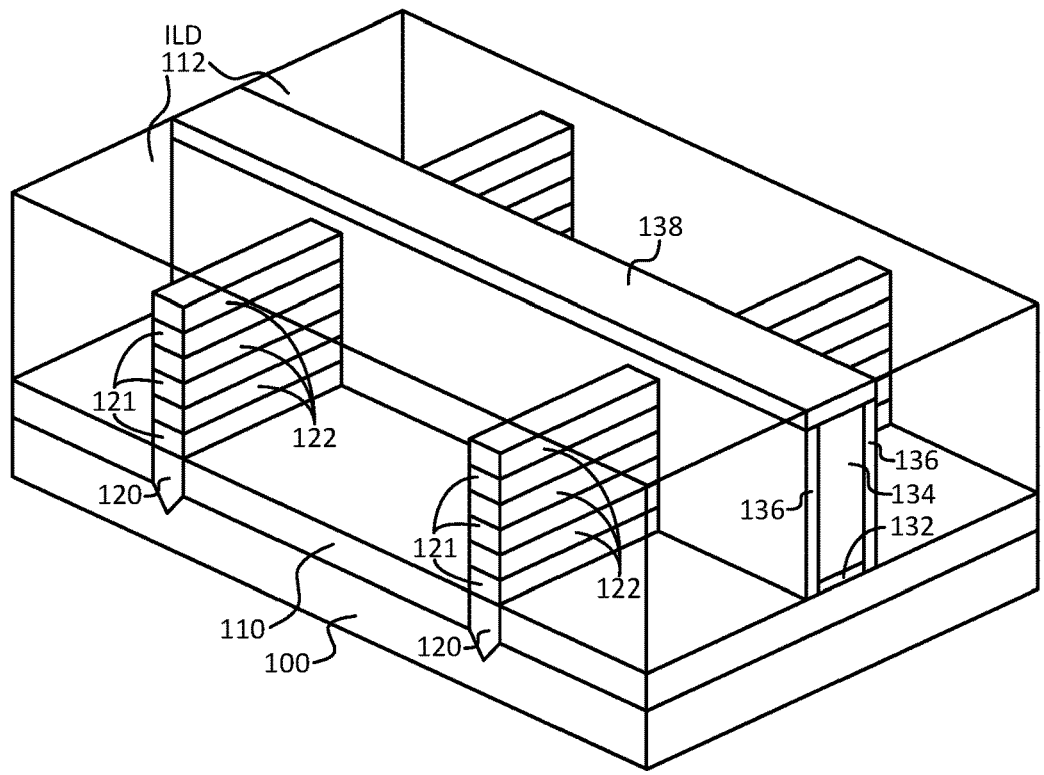
Figure 8:
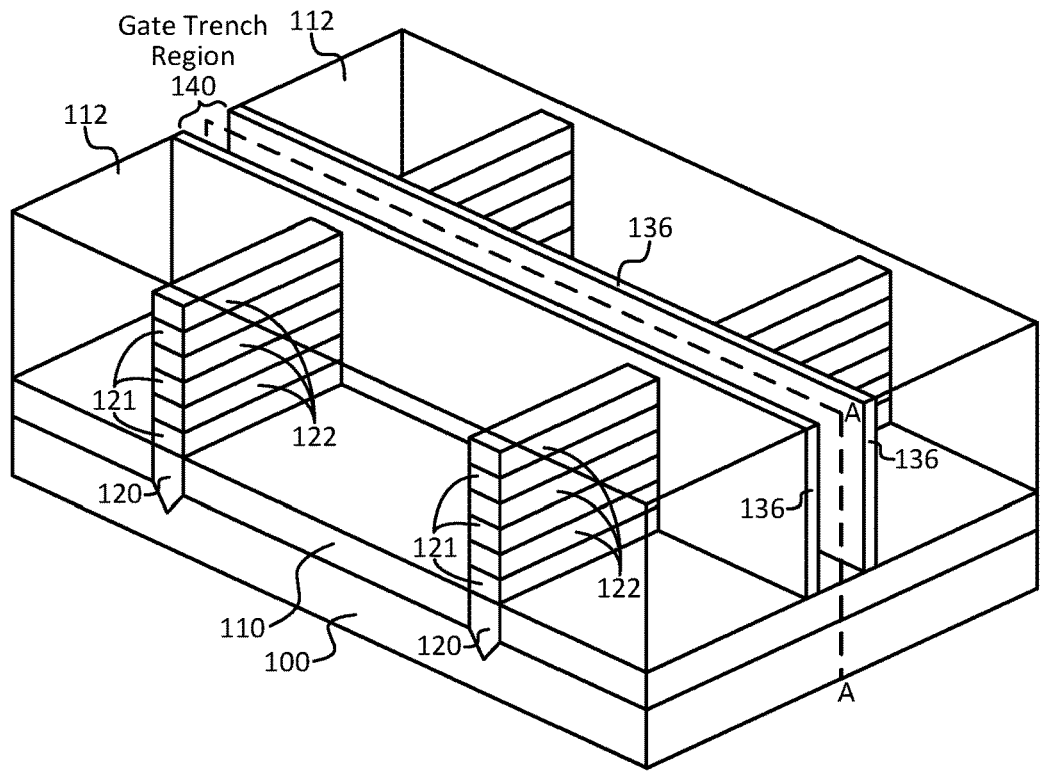
Figure 9:
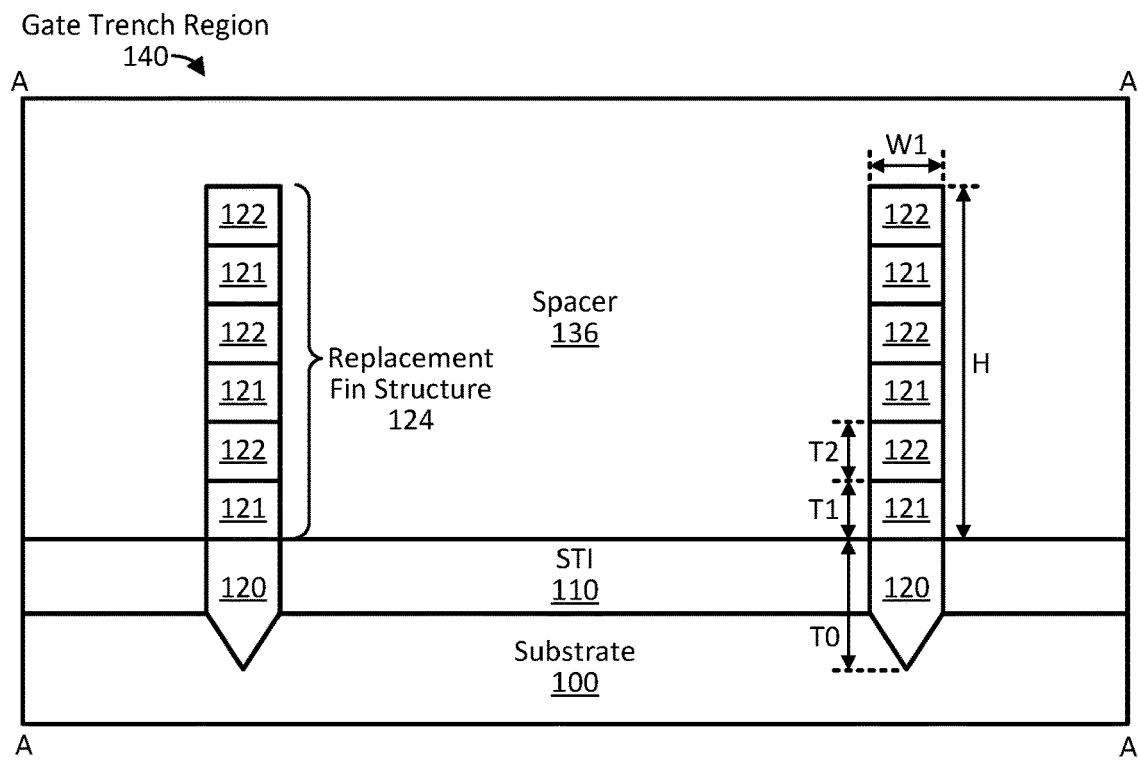
Figure 10:
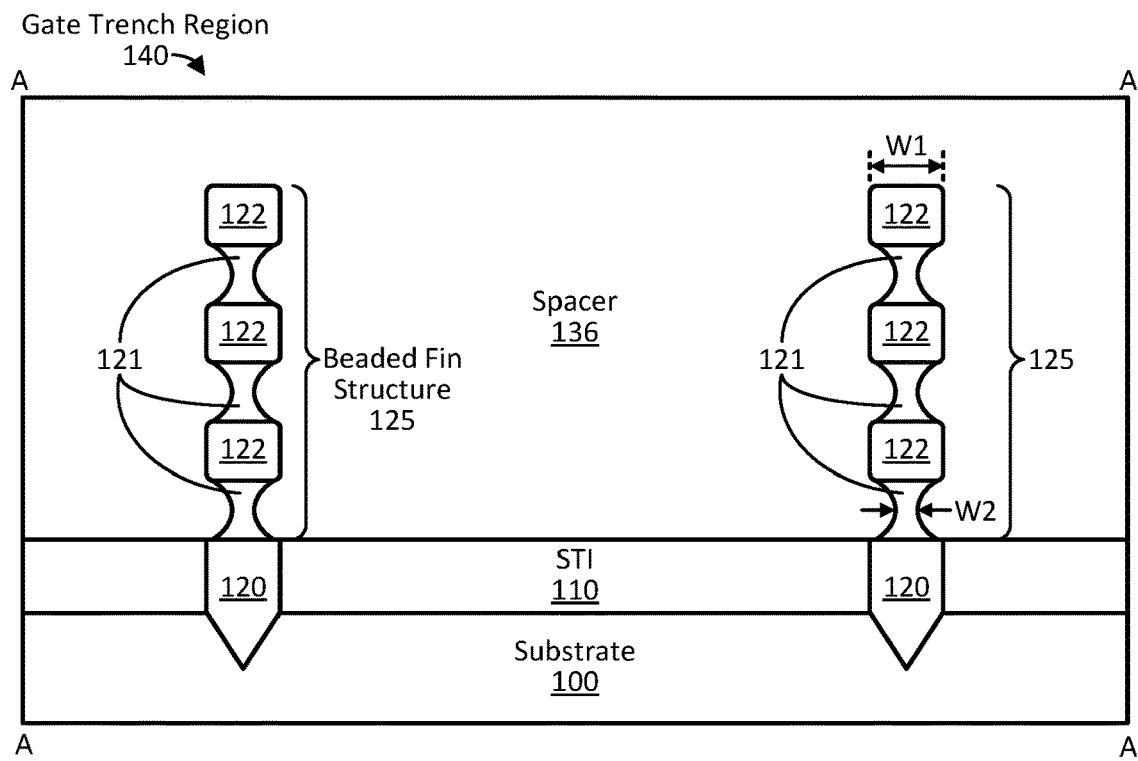
Figure 11:
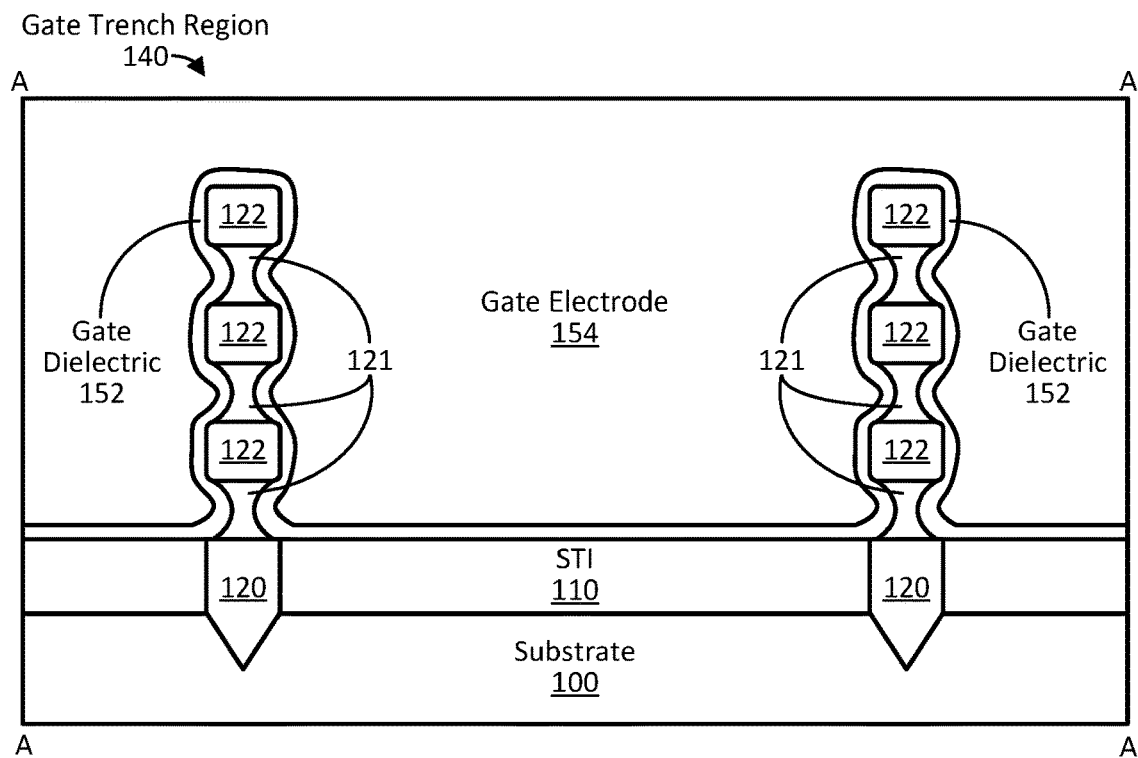

FIGS. 1-12 illustrate example integrated circuit structures resulting from a method configured to form transistors including beaded fin configurations, in accordance with some embodiments of this disclosure. Note that FIGS. 1-8 and 12 illustrate isometric views of the integrated circuit structure. Also note that FIGS. 9-11 illustrate cross-sectional planar views along plane A-A indicated in FIG. 8. In some embodiments, the techniques can be used to form beaded fin transistors having channel regions including any suitable semiconductor material, as can be understood based on this disclosure. In some embodiments, the techniques can be used to form p-type and/or n-type transistor devices, such as p-type MOSFET (p-MOS), n-type MOSFET (n-MOS), p-type tunnel FET (p-TFET), or n-type TFET (n-TFET), for example. Further, in some embodiments, the techniques may be used to benefit either or both of p-type and n-type transistors included in complementary MOS (CMOS) or complementary TFET (CTFET) devices, for example. Further, in some embodiments, the techniques may be used with devices of varying scales, such as transistor devices having critical dimensions in the micrometer range or in the nanometer range (e.g., transistors formed at the 32, 22, 14, 10, 7, or 5 nm process nodes, or beyond).

FIG. 1 illustrates an example structure including substrate 100 having fins 102 formed therefrom, in accordance with an embodiment. In some embodiments, fins 102 may be formed using any suitable techniques, such as one or more patterning and etching processes, for example. In some cases, the process of forming fins 102 may be referred to as shallow trench recess, for example. In this example embodiment, fins 102 are formed from substrate 100, but in other embodiments, fins may be formed above and/or on substrate 100 (e.g., using any suitable deposition/growth and patterning techniques). For example, in such embodiments where fins are formed above and/or on substrate 100, one or more layers may be formed on substrate 100 and fins 102 may be formed from the top layer. FIG. 1 also shows trench 115 formed between fins 102, in this example embodiment. In some embodiments, the fins may be formed to have varying widths Fw and heights Fh. In some embodiments, the fin widths Fw may be in the range of 5-400 nm, or any other suitable value, as will be apparent in light of this disclosure. In some embodiments, the fin heights Fh may be in the range of 10-800 nm, or any other suitable value, as will be apparent in light of this disclosure. In embodiments employing an aspect ratio trapping (ART) scheme, the fins may be formed to have particular height to width ratios such that when they are later recessed and/or removed, the resulting fin trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio of the fins (Fh:Fw) may be greater than 1, such as greater than 1.5, 2, 2.5, 3, 3.5, 4, 4.5, 5, 6, 7, 8, 9, or 10, or any other suitable threshold ratio, as will be apparent in light of this disclosure. Note that although two fins are shown in the example structure of FIG. 1 for illustrative purposes, any number of fins may be formed, such as one, five, ten, hundreds, thousands, millions, and so forth, depending on the end use or target application.

Substrate 100, in some embodiments, may include: a bulk substrate including group IV material, such as silicon (Si), germanium (Ge), SiGe, or silicon carbide (SiC) and/or group III-V material and/or sapphire and/or any other suitable material depending on the end use or target application; an X on insulator (XOI) structure where X is one of the aforementioned materials (e.g., group IV and/or group III-V and/or sapphire) and the insulator material is an oxide material or dielectric material or some other electrically insulating material (e.g., a buried oxide (BOX) layer scheme); or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Although only a portion of substrate 100 is shown in this example embodiment, substrate 100 may include any suitable thickness (the vertical dimension in the direction of the fin height Fh), such as having a thickness in the range of 1 to 950 microns, for example. In some embodiments, substrate 100 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

Figure 2:
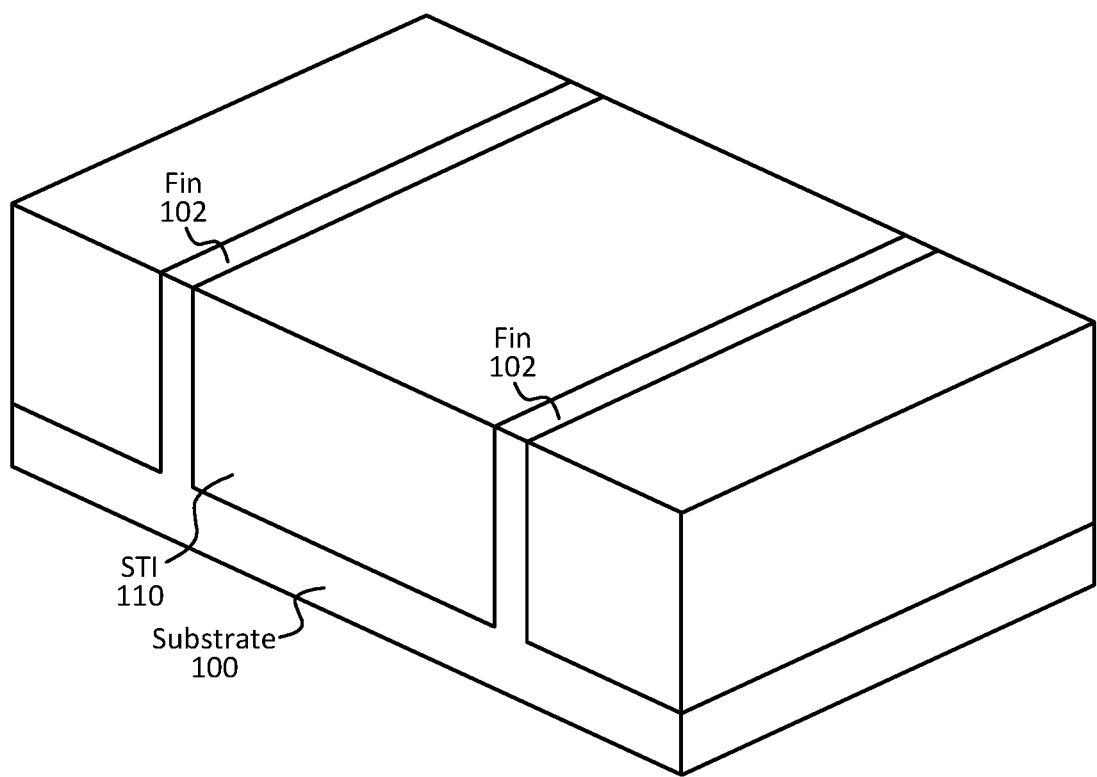

FIG. 2 illustrates an example structure formed after shallow trench isolation (STI) 110 processing has been performed in trenches 115 of the structure of FIG. 1, in accordance with an embodiment. In some embodiments, STI processing may include any suitable techniques, such as deposition of the STI material 110 followed by an optional planarization or polish process, for example. Any suitable deposition process may be used for the STI 110 deposition and the STI material may be selected based on the material of substrate 100 (e.g., to provide appropriate isolation and/or passivation), in some embodiments. For example, in the case of a Si substrate 100, STI material 110 may include silicon dioxide and/or silicon nitride. However, in some embodiments, STI material 110 may include any suitable electrical insulator, dielectric, oxide, and/or nitride material, as will be apparent in light of this disclosure.

Figure 3:
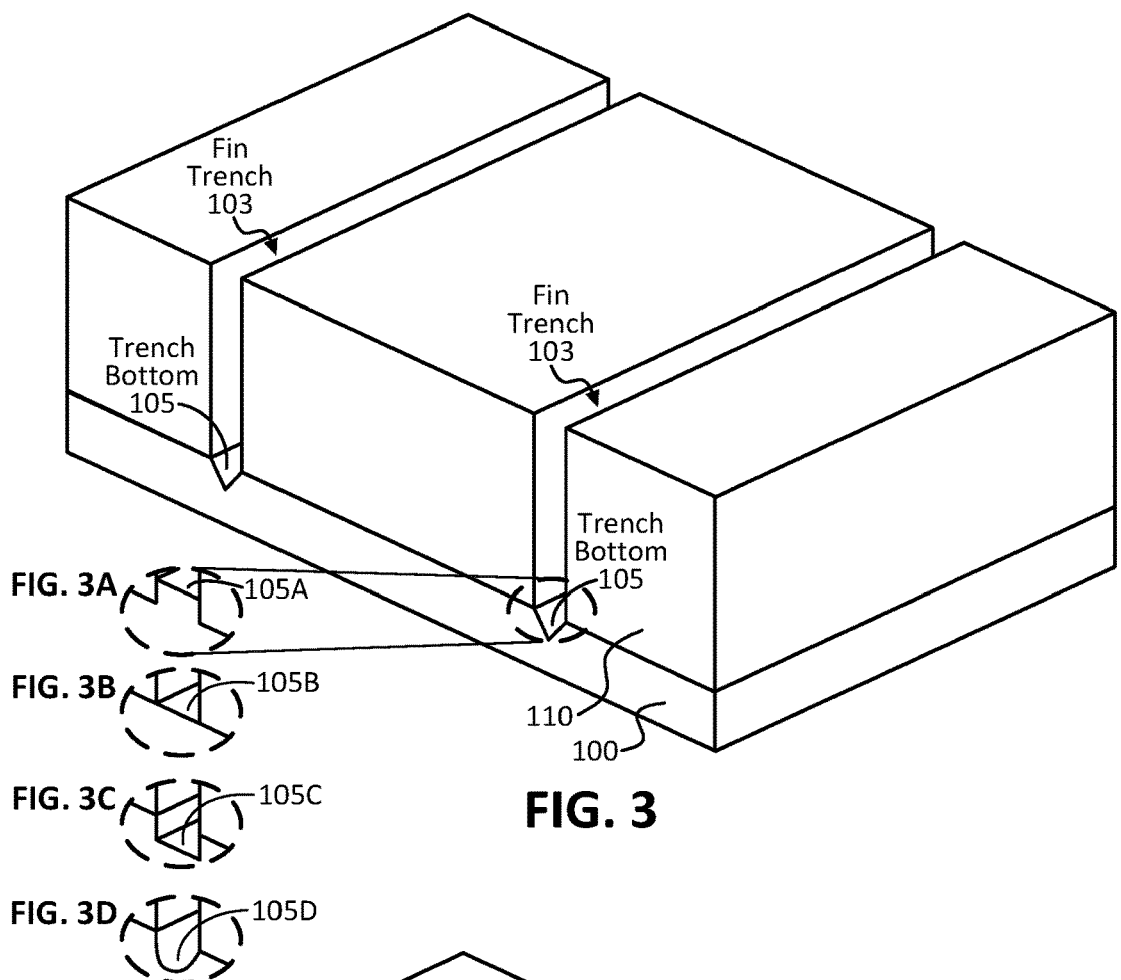

FIG. 3 illustrates an example structure formed after fins 102 have been removed from the structure of FIG. 2 to form fin trenches 103, in accordance with an embodiment. In some embodiments, any suitable wet and/or dry etch processes may be used to remove fins 102 and form fin trenches 103, for example. In some such embodiments, the fin trenches 103 may include a desired or controlled size and shape, based on the size and shape of fins 102 and/or based on the conditions used during the etch to form fin trenches 103, for example. As can be understood based on this disclosure, fin trenches 103 may be the same as or similar in size as fins 102, and thus include a width similar to Fw described above and a height or depth similar to Fh described above. However, in some embodiments, variation may occur to one or both of the dimensions, such as in the case where the etch used to form the fin trench 103 also removes substrate 100 material below the bottom STI 110 plane, such as is the case in this example embodiment. In the example structure of FIG. 3, the fin trench bottoms 105 include faceting as shown, which can facilitate growth of subsequently deposited materials, for example. In this example embodiment, the faceting at the fin trench bottoms 105 is shown as a {111} faceting, which includes a triangular shape at the bottom of the trench. In such an embodiment, the {111} faceting at the bottom of the trench may be used to facilitate the growth of material deposited thereon, as will be described in more detail below. In some embodiments, any trench bottom geometry may be formed, such as a flat geometry 105A-C as shown in FIGS. 3A-C, respectively, or a curved faceting 105D as shown in FIG. 3D, for example. In some embodiments, the fin trench bottom may be above the interface between substrate 100 and STI material 110, such as fin trench bottom 105A shown in FIG. 3A, for example. In such an embodiment, a portion of fin material 102 remains after the etch has been performed, as shown. In some embodiments, the fin trench bottom may be at the interface between substrate 100 and STI material 110, such as fin trench bottom 105B shown in FIG. 3B, for example. In some embodiments, the fin trench bottom may be below the interface between substrate 100 and STI material 110, such as fin trench bottom 105C shown in FIG. 3C, for example. In any such embodiments, the processing used to recess and/or remove fins 102 may or may not remove the entirety of the fin material and may or may not etch into substrate 100, as can be understood based on this disclosure. Accordingly, the present disclosure is not intended to be limited to any specific fin trench bottom configuration, unless otherwise stated.

Figure 4:
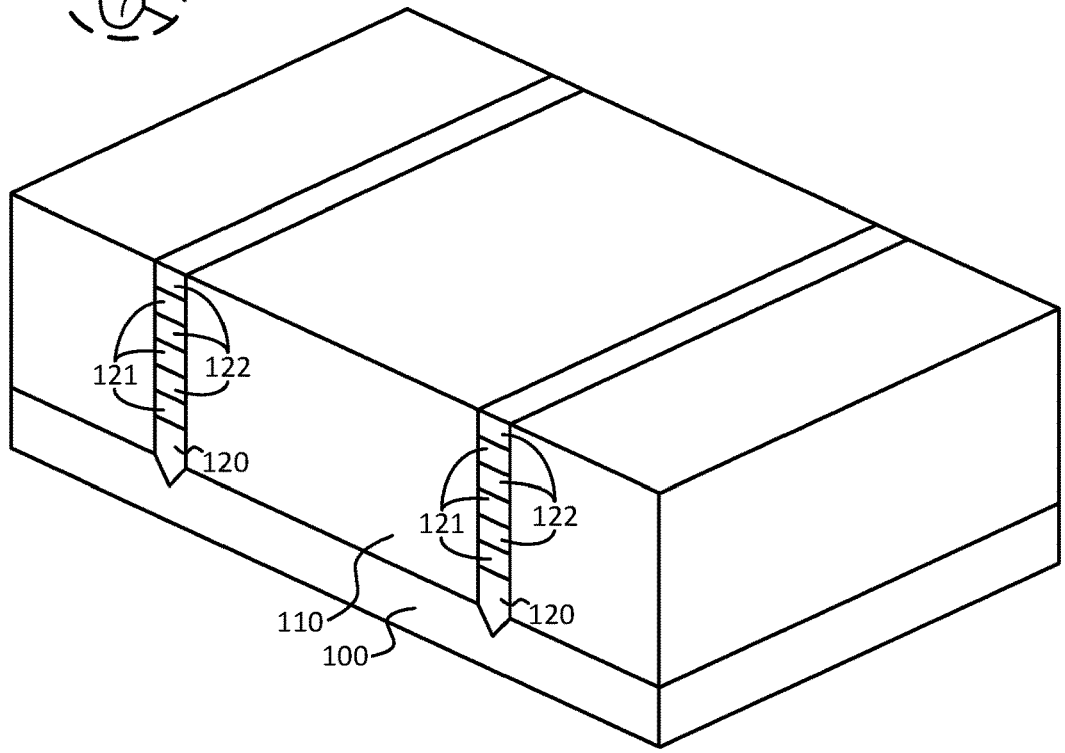

FIG. 4 illustrates an example structure formed after multiple material layers 120, 121, 122 have been deposited in the fin trenches 103 of the structure of FIG. 3, in accordance with an embodiment. In some such embodiments, fin trenches 103 may be sufficiently narrow and/or sufficiently deep (e.g., with a height:width ratio of at least 2, or any other suitable ratio as previously described for Fh:Fw) for the deposition or epitaxial growth of the multi-layer structure to employ an ART scheme and to contain lattice defects (e.g., misfit dislocations, stacking faults, and so forth) to the very bottom of the trench. This may be achieved by causing defects to terminate at non-crystalline (e.g., STI material 110) sidewalls, where the sidewalls are sufficiently high relative to the size of the growth area so as to trap most, if not all, of the defects. In some embodiments, any suitable techniques may be used for depositing/growing material layers 120, 121, and 122, such as metal-organic chemical vapor deposition (MOCVD), molecular-beam epitaxy (MBE) chemical vapor deposition (CVD), atomic layer deposition (ALD), and/or physical vapor deposition (PVD), to name some example processes. In some embodiments, the deposition/growth of material layers 120, 121, and/or 122 may be selective, such that the material only forms in fin trenches 103 or primarily forms in fin trenches 103 (e.g., where at least 60, 70, 80, 90, or 95% of the material forms in fin trenches), for example. In some such embodiments, some of the material of layers 120, 121, and/or 122 may grow in other areas, such as on STI 110, for example. In some embodiments, any or all of layers 120, 121, and 122 may include a multilayer structure of two or more material layers. In some embodiments, any or all of layers 120, 121, and 122 may or may not include grading (e.g., increasing and/or decreasing) the content of one or more materials in at least a portion of the layer(s). Note that in some embodiments, material used to deposit the top second material layer 122 may have grown out from fin trench 103 and onto STI material, such that a planarization and/or polish process may have been performed to form the example structure of FIG. 4, as can be understood based on this disclosure. In this example embodiment, the materials deposited in fin trenches 103 include buffer layer 120, first material layers 121, and second material layers 120 as shown. Material layers 120, 121, and 122 will be described in more detail below with reference to FIGS. 9-10.

Figure 5:
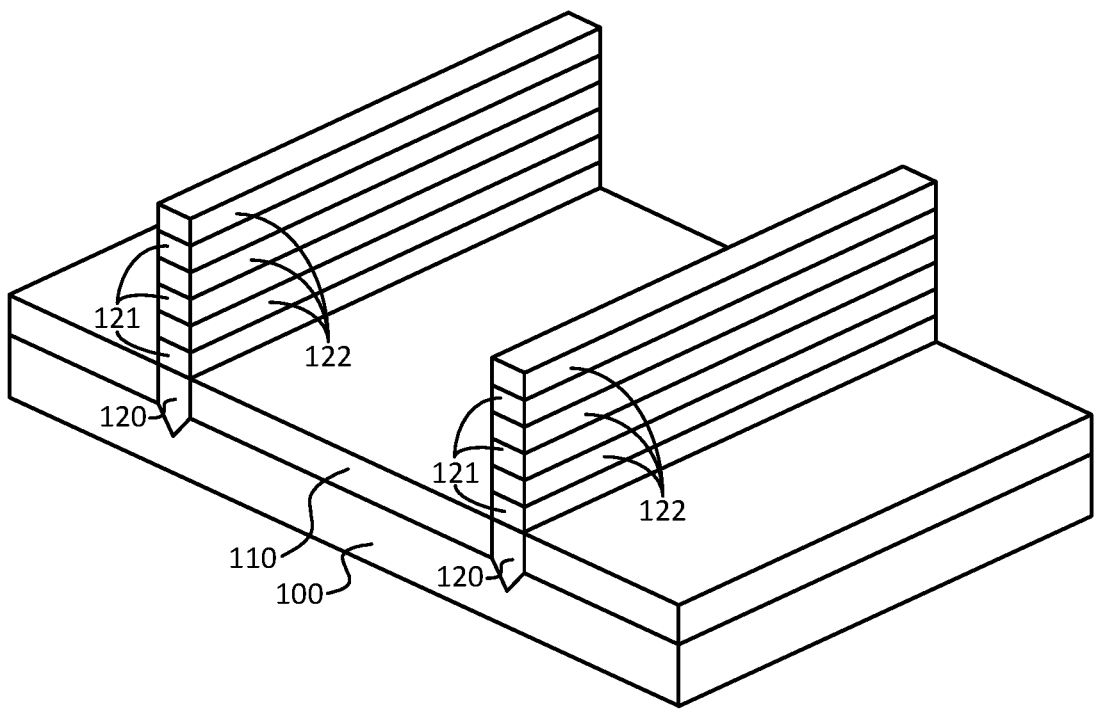

FIG. 5 illustrates an example structure formed after the STI material 110 of the structure of FIG. 4 has been recessed, in accordance with an embodiment. In some embodiments, recessing STI material 110 may be performed using any suitable techniques. In this example embodiment, STI material 110 was recessed to the same level as the interface between buffer layer 120 and first material layer 121, such that the entirety of buffer layer 120 is still between STI material 110 and the stack of alternating layers 121 and 122 is completely above the level of the top of the STI 110 plane. As will be apparent in light of this disclosure, the stack of alternating layers 121 and 122 will be used in the height of the beaded fin active channel region. However, in other embodiments, the STI material 110 may be recessed to a different height or depth, as can be understood based on this disclosure. For instance, in some embodiments, the recess process may be performed to target the top of the STI plane 110 to be below the 120/121 interface, such that a portion of the buffer layer 120 exudes from the top of the STI 110 plane, to name one example case. In some embodiments, the structure of FIG. 5 may be formed by blanket depositing the layers intended to be used in the beaded fin configuration (e.g., layers 121 and 122) and then etching the structure to form the fins of alternating 121/122 layers as shown. However, in some such embodiments, the benefits derived from the ART processing described herein may not be achieved, for example.

Figure 6:
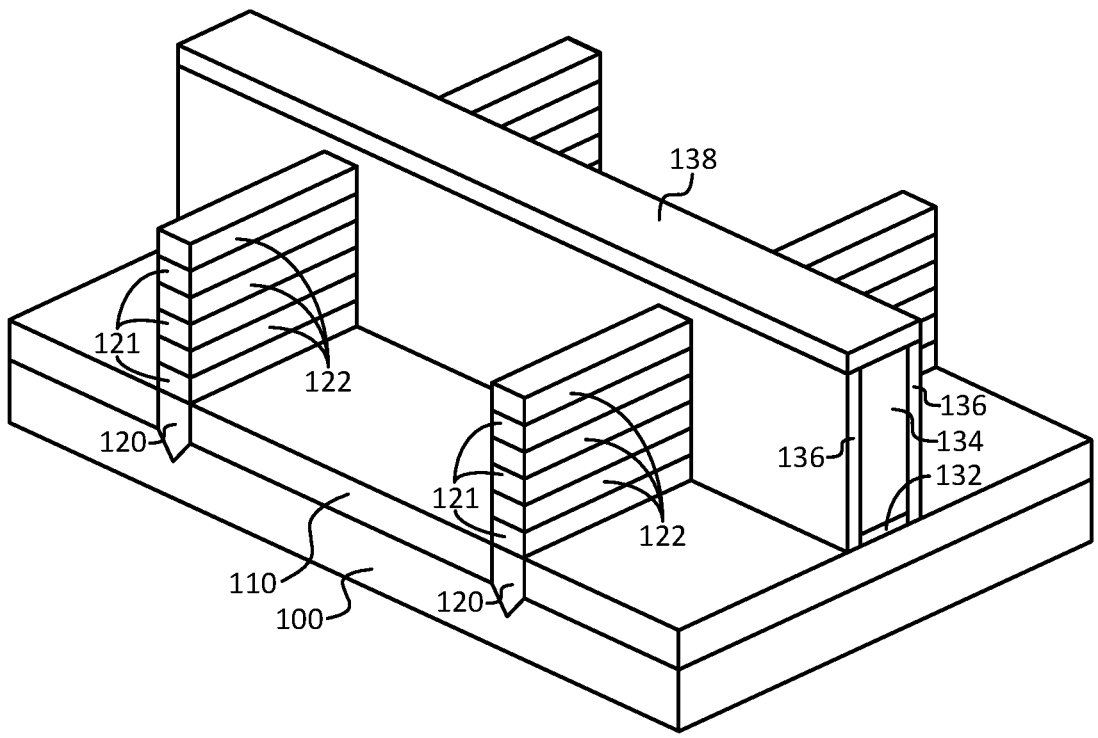

FIG. 6 illustrates an example structure formed after a dummy gate stack has been formed on the structure of FIG. 5, in accordance with an embodiment. In this example embodiment, dummy gate dielectric 132 (e.g., dummy oxide material) and dummy gate 134 (e.g., dummy poly-silicon material) may be used for a replacement gate process. As will be discussed with reference to FIG. 8, the dummy materials will be removed to allow for processing in the gate trench region of the structure to beaded fin transistor channel configurations. Formation of the dummy gate stack may include depositing the dummy gate dielectric material 132 and dummy gate electrode material 134, patterning the dummy gate stack, depositing gate spacer material 136, and performing a spacer etch to form the structure shown in FIG. 6, for example. Gate spacers 136 also referred to as sidewall spacers or simply, spacers, may include any suitable material, such as any suitable electrical insulator, dielectric, oxide (e.g., silicon oxide), and/or nitride (e.g., silicon nitride) material, as will be apparent in light of this disclosure. The example structure in this embodiment also includes a hardmask layer 138 over the gate stack, which may assist with subsequent processing, for example. Hardmask layer 138 may include any suitable material, such as a dielectric material, for example. As can be understood based on this disclosure, spacers 136 may be used to define the gate stack region and channel region (which may be the same region for the transistor), as well as the source and drain (S/D) regions.

FIG. 7 illustrates an example structure formed after a layer of interlayer dielectric (ILD) material 112 has been formed on the structure of FIG. 6, in accordance with an embodiment. Note that, in this example embodiment, insulator material 112 is illustrated as transparent to allow for underlying features to be seen. In some embodiments, the ILD material 112 may include any suitable electrical insulator, dielectric, oxide (e.g., silicon oxide), and/or nitride (e.g., silicon nitride) material, as will be apparent in light of this disclosure. In some embodiments, following deposition of the ILD material 112, a polish and/or planarization process may be performed to produce the example structure of FIG. 7.

FIG. 8 illustrates an example structure formed after the dummy gate stack (including dummy gate dielectric 132 and dummy gate electrode 134) of FIG. 7 has been removed to expose the gate trench region 140, in accordance with an embodiment. In some embodiments, removing the dummy gate stack may include first removing hardmask layer 138 and then removing the dummy gate stack (layers 134 and 132, in this example case) using any suitable techniques, such as wet and/or dry etching, polishing, and/or cleaning processes, for example. Plane A-A shown in FIG. 8 is used to indicate the location of the cross-sectional planar views of FIGS. 9-11, as can be understood based on this disclosure.

FIG. 9 illustrates a cross-sectional view taken along plane A-A of FIG. 8, in accordance with an embodiment. FIG. 9 is provided to illustrate the gate trench region 140 of the structure of FIG. 9, which will be formed into the channel region of one or more transistor devices, as can be understood based on this disclosure. As shown in the example structure of FIG. 9, the replacement fin structures 124 including layers 120 and 121, along with the sub-fin buffer layer 122, are shown with STI material 110 and substrate portion 100, as well as spacer material 136 that is behind the fin structures. As can be understood based on this disclosure, the structure in FIG. 9 includes sub-fin portion that is below the top of the STI 110 plane and a portion above the top of the STI 110 plane (indicated as replacement fin structure 124), which has a height H as shown, in this example embodiment. In some embodiments, height H may be in the range of 5-800 nm (e.g., 10-100 nm), or some other suitable height, as will be apparent in light of this disclosure. Recall that in this example embodiment, buffer layer 120 forms the entirety of the sub-fin portion and the stack of alternating layers 121 and 122 form the entirety of the active fin portion that is above the top of the STI 110 plane (and thus has a height H as indicated). As will be described in more detail with reference to FIG. 10, first material layers 121 include material that can be selectively removed (e.g., via selective etch processing) relative to second material layers 122. Note that, in some embodiments, such selective removal/etch process does not completely remove the material of first material layers 121, such that the layers 121 are formed into necked/narrower portions, thereby forming a beaded fin structure, as will be apparent in light of this disclosure.

As shown in FIG. 9, buffer layer 120 has a thickness T0 as indicated, and such thickness T0 may be in the range of 2-500 nm (e.g., 5-100 nm), in some embodiments, or some other suitable thickness, as will be apparent in light of this disclosure. As is also shown in FIG. 9, first material layers 121 and second material layers 122 each have a thickness T1 and T2, respectively, as indicated, and such thicknesses T1, T2 may be in the range of 1-200 nm (e.g., 2-20 nm), in some embodiments, or some other suitable thickness, as will be apparent in light of this disclosure. Note that although each of first material layers 121 are shown as having the same thicknesses T1 and each of second material layers 122 are shown as having the same thicknesses T2 for ease of illustration in this example embodiment, the present disclosure is not intended to be so limited, unless otherwise stated. For example, in some embodiments, the thicknesses of similar material layers may deviate by at least 5, 10, 15, 20, 25, 30, 40, or 50% relative to other similar material layers, or some other suitable threshold deviation, as will be apparent in light of this disclosure. Further note that although T1 is shown as being equal to T2 for ease of illustration in this example embodiment, the present disclosure is not intended to be so limited, unless otherwise stated. For example, in some embodiments, the ratio T1:T2 or T2:T1 may be at least 1, 1.5, 2, 2.5, 3, 3.5, 4, 4.5, or 5, or some other suitable ratio, as will be apparent in light of this disclosure.

FIG. 10 illustrates the example structure of FIG. 9 after selective etch processing has been performed to partially remove material from first material layers 121 and form the beaded fin structures 125 shown, in accordance with an embodiment. In some embodiments, the selective etch processing includes one or more etch processes using an etchant that selectively removes material from first material layers 121 relative to the removal of material from second material layers 122. In some such embodiments, the selective etch may remove material from the first material layers 121 at a rate of at least 1.5, 2, 3, 4, 5, 10, 100, or 1000 times faster relative to the removal of material from second material layers 122, or some other suitable threshold relative rate, as will be apparent in light of this disclosure. Although the selective etch processing is being performed only in gate trench region 140 in this example embodiments, in other embodiments, the selective etch processing to form beaded fin structures 125 may be performed on the entirety of the multilayer fin structures (e.g., on the entirety of the multilayer fin structures shown in FIG. 5). Note that in some embodiments, the selective etch processing may also be relative to the STI material 110, such that STI material 110 is not removed or removed at a relatively slower rate than the rate at which material from first material layers is removed, for example. As shown in the example structure of FIG. 10, the selective etch process performed only partially removes material from first material layers 121, thereby creating necked/narrower portions having a minimum width W2, whereas the second material layer portions 122 maintained their original width W1 and are thus relatively wider portions (relative to portions 121). In other words, the beaded fin structure 125 includes layers 121 and 122 that are still in contact (e.g., each 121 layer is in contact with at least one 122 layer, and vice versa), which can be contrasted with a gate-all-around (GAA) configuration that includes nanowires that are not in contact with each other in the channel region (and thus allow for the gate stack to wrap all around each nanowire). Note that in some embodiments, the second material layer portions 122 may narrow out some as a result of the selective etch process performed to partially remove material from the first material layer portions 121. Also note that although three 121/122 layer sets are shown in the example structure of FIG. 9, and thus three sets of a relatively wider material portion (having minimum width W1) and a relatively narrower material portion (having minimum width W2), the present disclosure is not intended to be so limited. For instance, in some embodiments, the integrated circuit structure may include 1, 2, 4, 5, 6, 7, 8, 9, or 10 sets, or any other suitable amount of sets of layers having relatively different widths, as will be apparent in light of this disclosure. Further note that in some embodiments, the beaded fin structure 125 may not include exact sets of material layers, which will be described herein, along with some other variations that may occur in the beaded fin structure, with reference to FIGS. 10A-B.

Buffer layer 120, in some embodiments, may include any suitable material, such as a group IV material and/or a group III-V material, for example. In some embodiments, the material of buffer layer 120 may be selected based on the material of substrate 100 and/or the material of overlying layer 121, for example. In an example embodiment, buffer layer 120 may include III-V material, such as InAs, GaAs, or InP, to name some examples. In another example embodiment, buffer layer 120 may include SiGe (e.g., where substrate 100 includes Si and first material layers include Ge). In some embodiments, buffer layer may be present under the stack of alternating layers 121/122 (to be used as the active channel region) to 'wet' the bottom of fin trenches 103 when forming the stack of alternating layers 121/122 and/or to act as seeding material and/or to help eliminate or reduce sub-fin leakage, for example. Further, in some embodiments, the stack of alternating layers 121/122 may be strained to the buffer layer 120, which may accommodate any misfit strain, for example. Moreover, in some embodiments, the buffer layer 120 may improve the quality of subsequently deposited alternating layers 121/122, such that those layers 121/122 are of high enough quality to be suitable in the active channel region of one or more transistors. In some embodiments, buffer layer 120 need not be present, and the stack of alternating layers 121/122 to be used in the beaded fin structure may be grown directly on the substrate material 100. For instance, in some such embodiments, a remainder of fin 102 may be present between STI material 110 (e.g., as shown in FIG. 3A), and the stack of alternating layers 121/122 may be formed thereon. Further, in some embodiments, the bottom first material layer 121 may extend down the entirety of the fin trench, such that material of that layer is both below and above the top of STI plane 110, for example. In embodiments where buffer layer 120 is present, it may take the shape of the trench bottom 105 shown in FIG. 3, where the shape is also shown in FIG. 9, for example.

First material layers 121 and second material layers 122, in some embodiments, may include material that allows for the selective removal of one relative to the other, as described herein. In some embodiments, first material layers 121 and second material layers 122 may include semiconductor material. For instance, in some embodiments, layers 121 and/or 122 may include group IV semiconductor material, such as Si, Ge, and/or SiGe, to name some examples. In some such embodiments, suitable material pairings for first material layers and second material layers (121/122) may include Si/Ge, Ge/Si, Si/SiGe, SiGe/Si, Ge/SiGe, and SiGe/Ge, to name some example 121/122 material pairings. In some embodiments, the material of each of the first material layers 121 and second material layers 122 may include SiGe, where one includes SiGe with relatively lower Ge content than the other. For example, in some such embodiments, one of material layers 121 and 122 may include SiGe with a first Ge content % (e.g., 10-80% Ge) and the other of material layers 121 and 122 may include SiGe with a second Ge content that is at least 10, 15, 20, or 25% greater than the first Ge content %, or some other suitable threshold % greater, as will be apparent in light of this disclosure. Note that in some embodiments, the group IV materials, when included in the beaded fin structure, may or may not include one or more material dopants. Various group IV materials can be used in the replacement fin structures of FIG. 9 to be formed into the beaded fin structures 125 of FIG. 10 as a result of the etch selectivity between such materials. In an example embodiment, where second material layers 122 include Si and first material layers 121 include SiGe (which may or may not be boron (B)-doped), an etchant including peroxide containing concentrated sulfuric or nitric acid may be used to selectively etch the SiGe material relative to the Si material and form the structure shown in FIG. 10, as can be understood based on this disclosure. In another example embodiment, where second material layers 122 include SiGe having 10-80% Ge content and the first material layers 121 include SiGe with at least 10% higher Ge content (which may or may not be B-doped), an etchant including peroxide containing concentrated sulfuric or nitric acid may be used to selectively etch the higher Ge content SiGe material relative to the lower Ge content SiGe material and form the structure shown in FIG. 10, as can be understood based on this disclosure.

First material layers 121 and/or second material layers 122, in some embodiments, In some embodiments, may include group III-V semiconductor material, such as InGaAs, InP, InAs, InSb, InAlAs, GaSb, InAsSb, GaAs, GaP, GaN, and/or InGaN, to name some examples. As previously described, when using different III-V materials that have lattice mismatch, the alternating layers may be kept thin enough, in some embodiments, such that they are below the critical thickness (above which the material layer relaxes and defects form), and such that III-V layers of dissimilar lattice constants can be incorporated in the beaded fin structure without defects between the layers. Note that the critical thickness being referred to is in the dimension shown as T1 and T2 in FIG. 9. Further, in some such embodiments, a super lattice structure can be formed without the defect penalty that would typically accompany such a structure. In some embodiments, suitable material pairings for first material layers and second material layers (121/122) may include InAs/InGaAs, GaAs/InGaAs, InP/InGaAs, and InGaN/GaN, to name some example 121/122 material pairings. In some embodiments, the material of each of the first material layers 121 and second material layers 122 may include InGaAs, where one includes InGaAs with relatively lower indium content than the other. For example, in some such embodiments, one of material layers 121 and 122 may include InGaAs with a first indium content % (e.g., less than 50%, such as $In_{0.2}Ga_{0.8}As$) and the other of material layers 121 and 122 may include InGaAs with a second indium content that is at least 10, 15, 20, or 25% greater than the first indium content % (such as $In_{0.7}Ga_{0.3}As$), or some other suitable threshold % greater, as will be apparent in light of this disclosure. Note that description of indium content % in InGaAs herein is with reference to the relative gallium content, which may be expressed as $In_xGa_{1-x}As$ where x ranges from 0 to 1, for example, and x represents the decimal form of the indium percentage. Further note that in some such embodiments, as the indium content % is decreased, the bandgap may increase and the mobility may decrease, and conversely, as the indium content is increased, the bandgap may decrease and the mobility may increase. For example, the bandgap of InGaAs may range from 0.36 eV (e.g., where indium content is 100% and thus the material is InAs) to 1.43 eV (e.g., where indium content is 0% and thus the material is GaAs), depending on the indium content %. Note that in some embodiments, the group III-V materials, when included in the beaded fin structure, may or may not include one or more material dopants. Various group III-V materials can be used in the replacement fin structures of FIG. 9 to be formed into the beaded fin structures 125 of FIG. 10 as a result of the etch selectivity between such materials. In an example embodiment, where second material layers 122 include InGaAs and first material layers 121 include GaAs, an etchant including a strong base (e.g., KOH and/or NaOH) may be used to selectively etch the GaAs material relative to the InGaAs material and form the structure shown in FIG. 10, as can be understood based on this disclosure. In some embodiments, the beaded fin structure 125 may include a combination of group IV semiconductor materials and group III-V semiconductor materials, and/or any other suitable material(s), as can be understood based on this disclosure. Numerous material configurations for beaded fin structure 125 will be apparent in light of this disclosure.

First material layers 121 and second material layers 122, in some embodiments, may be selected based on the bandgap properties of the materials of the layers and/or based on the difference in the bandgap properties of the materials of the layers. For instance, in some embodiments, it may be desired to select a material with a relatively wider bandgap for first material layers 121 (the narrower/necked portions) to assist with cutting off undesired off-state leakage, for example. To provide an example material configuration fitting such a case, the beaded fin structure 125 may include first material layers 121 including GaAs and second material layers 122 including InGaAs, in accordance with an embodiment. However, in some embodiments, it may be desired to select a material with a relatively narrower bandgap for first material layers 121 (the narrower/necked portions) to increase carrier mobility in the channel region through those portions, for example. To provide an example material configuration fitting such a case, the beaded fin structure 125 may include first material layers 121 including InAs and second material layers including InGaAs, in accordance with an embodiment. In some such embodiments, if the necked portions have a width (W2) that is narrow enough, the material may experience increased quantization (e.g., due to quantum confinement), such that materials with relatively narrower bandgaps can be used in necked/narrower portions 121 without increased current in the transistor off-state (Ioff), as will be described in more detail below. In some embodiments, the necked portions 121 of the beaded fin configuration are more easily depleted of charge as a result of such portions having been narrowed (e.g., relative to their original width, shown as W1), as can be understood based on this disclosure.

In some embodiments, material included in first material layers 121 and/or second material layers 122 may have a bandgap of at least some value in the range of 0.1 to 3.3 eV, or at least some other suitable threshold value, as will be apparent in light of this disclosure. For example, if the threshold minimum bandgap value is selected to be 1.1 eV for second material layers 122, then suitable materials for layers 122 may include Si, SiGe (with low content % of germanium, such as less than 10%), GaAs, InP, InGaAs (with low content % of indium, such as less than 10%), GaN, and/or InGaN, to name some examples. In some embodiments, material included in first material layers 121 and/or second material layer 122 may have a bandgap of at most some value in the range of 3.5 to 0.3 eV, or at most some other suitable threshold value, as will be apparent in light of this disclosure. For example, if the threshold maximum bandgap value is selected to be 1.1 eV for first material layers 121, then suitable materials for layers 121 may include Ge, SiGe (with high content % of germanium, such as greater than 50%), InAs, InGaAs (with high content % of indium, such as greater than 50%), GaSb, and/or InSb, to name some examples. In some embodiments, the difference in bandgap between the material of layers 121 and 122 or between the material of layers 122 and 122 (so either bandgap values of 121-122 or 122-121) may be at least some value in the range of 0.1 to 3 eV, or some other suitable minimum difference, as will be apparent in light of this disclosure. For example, if the difference in bandgap between the material of layers 122 and 121 (or between the material of layers 121 and 122) is at least 0.3 eV, then material pairings for the layers 122/121 (or 121/122) may include Si/Ge, InGaAs/InAs, and GaAs/InGaAs, to name some examples. Recall, in some embodiments, a narrower bandgap material in the beaded fin channel configuration 125 may provide improved carrier mobility and on-state current, while a wider bandgap material in the beaded fin channel configuration 125 may provide improved gate control and off-state leakage.

FIGS. 9-10 illustrate that, in this example embodiment, the selective etch process caused first material layers 121 to narrow down to a minimum width W2 from the original width W1. As shown in this example embodiment, second material layers 122 maintained the original minimum width W1 (or the minimum width of layers 122 may have slightly decreased as a result of the selective etch process). However, in some embodiments, the selective etch process used to form the beaded fin structures 125 in FIG. 10 may substantially remove material from both layers 121 and 122, but such removal may occur at a faster rate for layers 121, for example. As can be understood based on this disclosure, minimum widths W1 and W2 may be measured as the dimension between portions of the gate stack adjacent to both sides of the channel region, as the gate stack wraps around the beaded fin structure (e.g., as shown in FIG. 11). In some embodiments, multiple selective etch processes may be performed, such as a first selective etch process to remove material from layers 121 and then a second selective etch process to remove material from layers 122, for example. For instance, in an example case where first material layers 121 include InP and second material layers 122 include InGaAs, a first selective etch including an HCl-based etchant may be used to narrow (or partially remove material from) the InP material layers 121 and a second selective etch including a citric peroxide-based etchant may be used to narrow (or partially remove material from) the InGaAs material layers 122, in accordance with an example embodiment. In some embodiments, other material layers may be included in the replacement fin structure, such that multiple selective etch processes can be performed to remove material from one or more material layers during each etch process. An example of such an embodiment will be described in more detail with reference to FIG. 10A.

Continuing with the example structure of FIG. 10, second material layers 122 have a minimum width W1 that is greater than the minimum width W2 of first material layers 121, in this example embodiment. In some embodiments, W1 may be in the range of 4 to 100 nm (e.g., 4 to 30 nm), or some other suitable width, as will be apparent in light of this disclosure. In some embodiments, W2 may be in the range of 2 to 50 nm (e.g., 2 to 15 nm), or some other suitable width, as will be apparent in light of this disclosure. In some embodiments, W1 may be greater than W2 by at least 2, 5, 10, 15, 20, 30, 40, or 50 nm, or some other suitable threshold difference, as will be apparent in light of this disclosure. In some embodiments, the ratio of W1:W2 may be at least 1.5, 2, 2.5, 3, 3.5, 4, 4.5, or 5, or some other suitable threshold ratio, as will be apparent in light of this disclosure. In some embodiments, widths W1 and/or W2 may be determined based on the selective etch processing performed. Therefore, in some such embodiments, the conditions of the selective etch processing may be controlled to form beaded fin structures with different material portions having different desired widths, as can be understood based on this disclosure.

In some embodiments, selectively etching the first material layers 121 to a narrow width (e.g., where W2 is very small, such as less than 10 nm) may cause increased quantization (e.g., due to quantum confinement) in the layers such that the bandgap effectively increases in those layers thereby increasing gate control, for example. It can also be understood that in some such embodiments, the surface area of the gate stack on such necked/narrowed portions increases as W2 decreases or as the narrowing of the portions is increased (e.g., relative to a typical fin structure, such as the replacement fins shown in FIG. 9). Further, in some such embodiments, off-state current (Ioff) may be improved by making the necked/narrow portions of the beaded fin channel configuration narrow enough, such as less than 10, 8, 6, 4, or 2 nm, or some other suitable maximum threshold value. Further still, in some such embodiments, the narrowing of the necked portions may allow for the use of relatively lower bandgap materials, which have relatively increased mobility and injection velocity, while still maintaining suitable gate control. For instance, in the example case of some III-V materials (such as $In_{0.7}Ga_{0.3}As$, to name one specific example), as the body thickness of the material layer decreases (e.g., from 10 to 8 to 6 to 4 to 2 nm), the bandgap increases and thus the gate control of the material layer also improves. Numerous other benefits of the techniques described herein will be apparent in light of this disclosure.

Figure 10A:
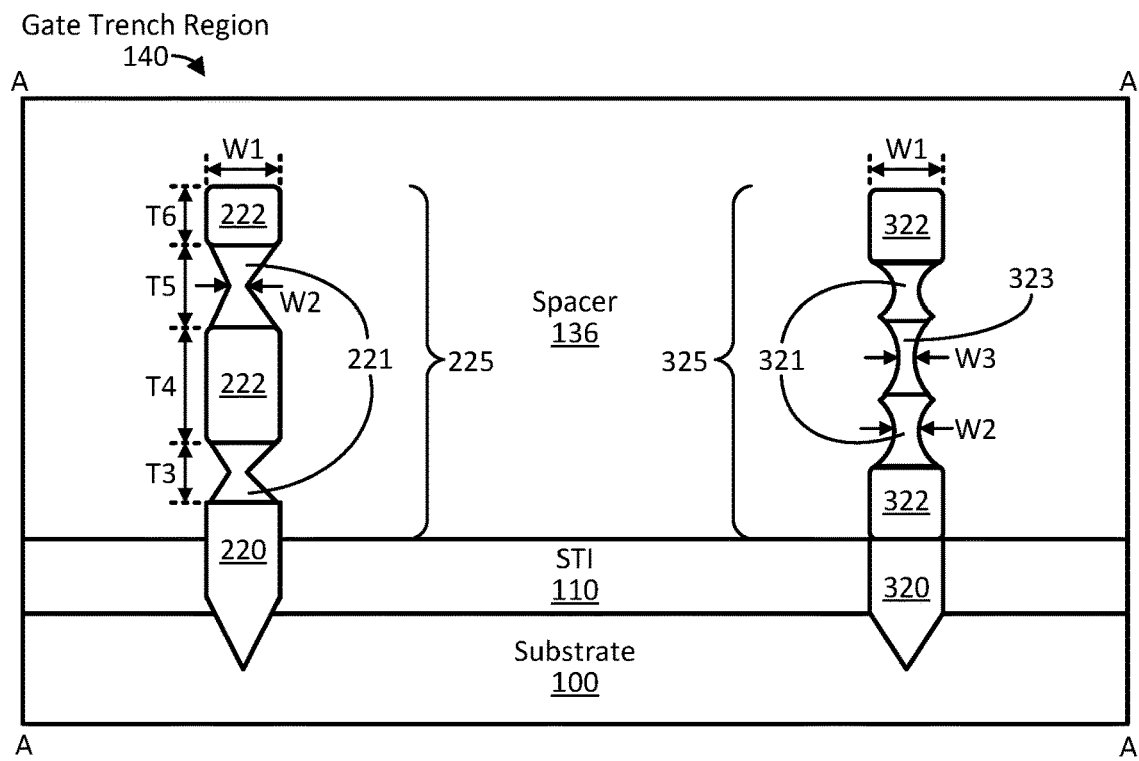
FIGS. 10A-B (provided after FIG. 10) illustrate the example integrated circuit structure of FIG. 10, including some structural variations to the beaded fin structure, in accordance with some embodiments of this disclosure.
Figure 10B:
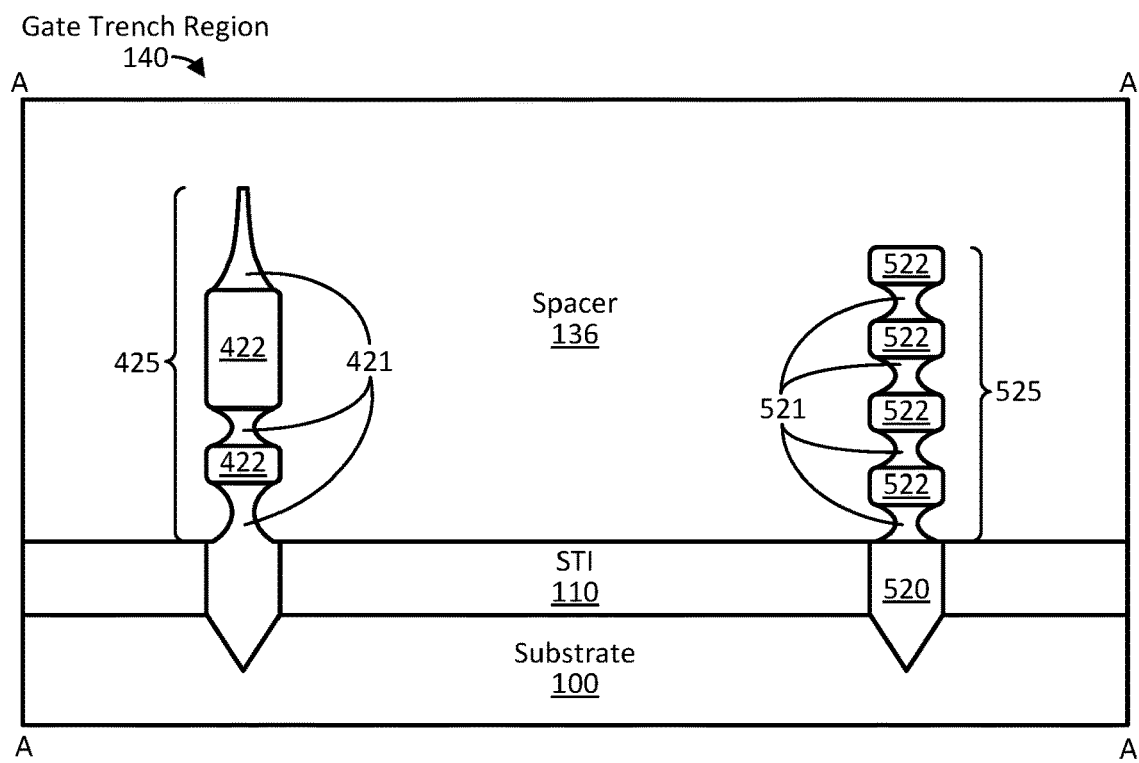

FIGS. 10A-B illustrate the example integrated circuit structure of FIG. 10, including some structural variations to the beaded fin structure, in accordance with some embodiments of this disclosure. As is shown, FIGS. 10A-B show the same gate trench region 140 as shown in FIG. 10, including substrate 100, STI 110, and spacer 136, as described herein. Therefore, the previous relevant description of such features is equally relevant to the structures of FIGS. 10A-B. As is also shown, each of the structures in FIGS. 10A and 10B include two different beaded fin structures, where FIG. 10A includes beaded fin structure 225 on the left and beaded fin structure 325 on the right, as indicated, and FIG. 10B includes beaded fin structure 425 on the left and beaded fin structure 525 on the right. Note that the beaded fin structures 225, 325, 425, and 525 each include feature identification numbers having the same last two digits as beaded fin 125 includes, such as beaded fin structure 225 including buffer layer 220, first material layers 221, and second material layers 222, and so forth. Also note that beaded fin structure 325 introduces a third material layer 323, as will be described in more detail below. As can be understood based on this disclosure, a transistor structure including any of the alternative beaded fin structures (e.g., 225, 325, 425, or 525) would include such structures below and adjacent to a gate stack, such as is shown in FIG. 11 for beaded fin structure 125.

Beaded fin structure 225 is provided in the example embodiment of FIG. 10A to illustrate some variations that may occur when forming a transistor including a beaded fin channel configuration. One such variation illustrated is that the number of layers is less than that shown in beaded fin structure 125, where beaded fin structure 225 includes only two sets of layers 221/222 (four total layers), whereas structure 125 included three sets of layers 121/122. In some embodiments, any number of sets of first and second material layers may be present in a beaded fin configuration, such as 1 to 20 sets, or any other suitable amount, as will be apparent in light of this disclosure. For example beaded fin structure 525 shown in FIG. 10B includes four sets of first material layers 521 and second material layers 522. In some embodiments, there may not be exact sets of layers, such that there are more first material layers than second material layers or such that there are more second material layers than first material layers. Structure 225 is also provided to illustrate that buffer layer 220, in this example structure, extends above the top of the STI 110 plane. Therefore, the portion that is above the top of the STI 110 plane may be included in the active channel region, for example. Structure 225 is also provided to illustrate that the selective etch process performed to narrow first material layers 221 causes asymmetrical and triangular-shaped etches (or removal of material) from the layers. This can be compared to the symmetrical and circular or elliptical-shaped etches (or removal of material) from layers 121 in the example beaded fin structure 125. In other embodiments, the selective etch may form other shapes in first material layers, such as a notch, square, rectangular, or otherwise wavy or irregular shape, to name some other examples. Regardless of the resulting shape of the first material layers, the minimum widths of the layers should still be able to be determined. For example the minimum width W2 of the first material layers 221 in structure 225 is still able to be determined and can be compared to the minimum width W1 of the second material layers 222. Structure 225 is also provided to illustrate that the thicknesses of the different layers in the beaded fin structure may not be consistent between the same material layers and/or between layers of different materials. For instance, in the example beaded fin structure 225, the four layers 221/222 all have different thicknesses shown as T3, T4, T5, and T6.

Beaded fin structure 325 is also provided in the example embodiment of FIG. 10A to illustrate some variations that may occur when forming a transistor including a beaded fin channel configuration. One such variation illustrated is that the structure 325 includes a third material layer 323 that may include any material described herein with reference to first material layers 121 and second material layers 122 (e.g., group IV and/or group III-V material). First material layers 321 and second material layers 322 are also present in structure 325, where layers 321 include minimum widths W2 and layers 322 include minimum widths W1. As shown, third material layer 323 has a minimum width W3 (which would be between portions of the gate stack in the final transistor structure), which is less than W1 and W2 in this example case; however, the present disclosure is not intended to be so limited. In some embodiments, minimum width W3 may be in the range of 2 to 50 nm (e.g., 2 to 15 nm), or some other suitable width, as will be apparent in light of this disclosure. As shown in this example embodiment, in contrast to structure 125, first material layers 321 are both between second material layers 322, and the bottom second material layer 322 is directly above and in contact with buffer layer 320; however, second material layers still are in contact with at least one first material layer. In some embodiments, the example beaded fin structure 325 shown may have been formed by performing a selective etch process that removed material from layer 323 at a faster rate than it removed material from layers 321 and at a faster rate than it removed material from layers 322. For instance, to provide an example, if first material layers 321 include InAs, second material layers 322 include GaSb, and third material layer 323 includes GaAs, using an etchant of hydrogen peroxide and citric acid (e.g., in a 1:5 ratio), the structure 325 shown may be formed using one selective etch process. In other embodiments, the example beaded fin structure 325 shown may have been formed by performing a first selective etch that removed material from layers 321 and/or 323 at a faster rate than it removed material from layers 322, followed by a second selective etch that removed material from layers 321 and/or 323 at a faster rate than it removed material from layers 322. As can be understood based on this disclosure, any number of different material layers may be present in a beaded fin channel configuration, and such different material layers may enable various selective etches based on the materials involved, such that numerous different structural variations and configurations can be achieved.

Beaded fin structures 425 and 525 are also provided in the example embodiment of FIG. 10B to illustrate some variations that may occur when forming a transistor including a beaded fin channel configuration. One such variation illustrated in structure 425 is that there is no buffer layer and instead, the bottom first material layer 421 extends into and occupies the space where buffer layer 120 was located in structure 125, for example. As previously explained, in some embodiments, a buffer layer as described herein (e.g., with reference to layer 120) need not be included. As shown, the portion of bottom first material layer 421 that extends upward from the top of the STI 110 plane (to be used in the active beaded fin channel configuration) was narrowed by the selective etch performed; however, the sub-fin portion of that layer was not narrowed, as is also shown. Structure 425 is also provided to illustrate that the thicknesses of the material layers 421/422 may not be consistent, as described with reference to structure 225. Structure 425 is also provided to show that a second material layer (such as layer 422) need not be located on the top of the beaded fin structure. In some such embodiments, the selective etch process may form a structure such as is shown in the top first material layer 421, for example. In other words, in some embodiments, the top of the beaded fin structure (where the top is farthest from the substrate) may be relatively wider between the gate stack material on opposing sides of the beaded fin structure than other portions of the structure (and may even be the widest portion, in some cases); however, in other embodiments, the top of the beaded fin structure may be relatively narrower between the gate stack material on opposing sides of the beaded fin structure than other portions of the structure (and may even be the narrowest portion, in some cases). Also note that in beaded fin structure 425, there is one more first material layer 421 (three, in this case) than there is second material layers 422 (two, in this case). As previously described, structure 525 is provided to illustrate that there may be four sets (or any number of sets) of first material layers and second material layers, shown as sets of layers 521 and 522, in this example embodiment. The example variations shown in FIGS. 10A-B and described herein are provided for illustrative purposes and are not intended to limit the present disclosure. Numerous beaded fin configurations will be apparent in light of this disclosure.

FIG. 11 illustrates an example structure after gate processing has been performed on the structure of FIG. 10, in accordance with an embodiment. After the beaded fin structures 125 have been formed, as shown in FIG. 10, gate stack processing can follow, such as a replacement metal gate (RMG) process flow, for example. In this example embodiment, the gate stack processing includes depositing a thin (e.g., 1-20 nm in thickness) gate dielectric layer 152 in the gate trench region. Note that in the example structure of FIG. 11, for ease of illustration, the gate dielectric layer 152 is shown as a thicker layer than it may appear in real life. As shown in this example embodiment, the gate dielectric material 152 is conformally deposited, such that is has a substantially similar thickness on all surfaces upon which it grows and tracks with the topography of the surfaces upon which it grows. In some embodiments, the gate dielectric material 152 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 152 to improve its quality when a high-k material is used, for example. In some embodiments, gate dielectric layer 152 may include a multi-layer structure of two or more material layers. In some embodiments, gate dielectric layer 152 may include grading (e.g., increasing and/or decreasing) the content of one or more materials in at least a portion of the layer.

Continuing with the structure of FIG. 11, in this example embodiment, the gate processing also includes depositing gate electrode material 154 (e.g., 20-800 nm in thickness) on the thin gate dielectric layer 152. A planarization and/or polish process may have been performed after depositing the gate electrode material 154 to form the example structure shown in FIG. 11. As shown, the gate electrode material 15 fills the remainder of gate trench region 140. In some embodiments, gate electrode 154 may include any suitable material, such as polysilicon, silicon nitride, silicon carbide, or various suitable metals or metal alloys, such as aluminum (Al), tungsten (W), titanium (Ti), tantalum (Ta), copper (Cu), niobium (Nb), titanium nitride (TiN), and/or tantalum nitride (TaN), to name some suitable materials. In some embodiments, gate electrode 154 may include a multilayer structure of two or more material layers. In some embodiments, gate electrode 154 may or may not include grading (e.g., increasing and/or decreasing) the content of one or more materials in at least a portion of the layer. In some embodiments, one or more additional material layers may be formed in the gate stack of FIG. 11. For instance, in some embodiments, an additional layer may be formed between gate dielectric layer 152 and gate electrode layer 154 to increase the interface quality between the layers and/or to improve the electrical properties between the layers, for example. Such additional layers may include one or more work-function material layers, for example. As shown in FIG. 11, the gate stack (including gate dielectric 152 and gate electrode 154) wraps around the sides and top of the beaded fin structures 125. Therefore, in some embodiments, the transistor gate stack may be above the beaded fin transistor channel region and also adjacent to both (or multiple) sides of the beaded fin transistor channel region, or in other words, the beaded fin transistor channel region may be below and between the transistor gate stack. Numerous gate stack configurations will be apparent in light of this disclosure.

Figure 12:
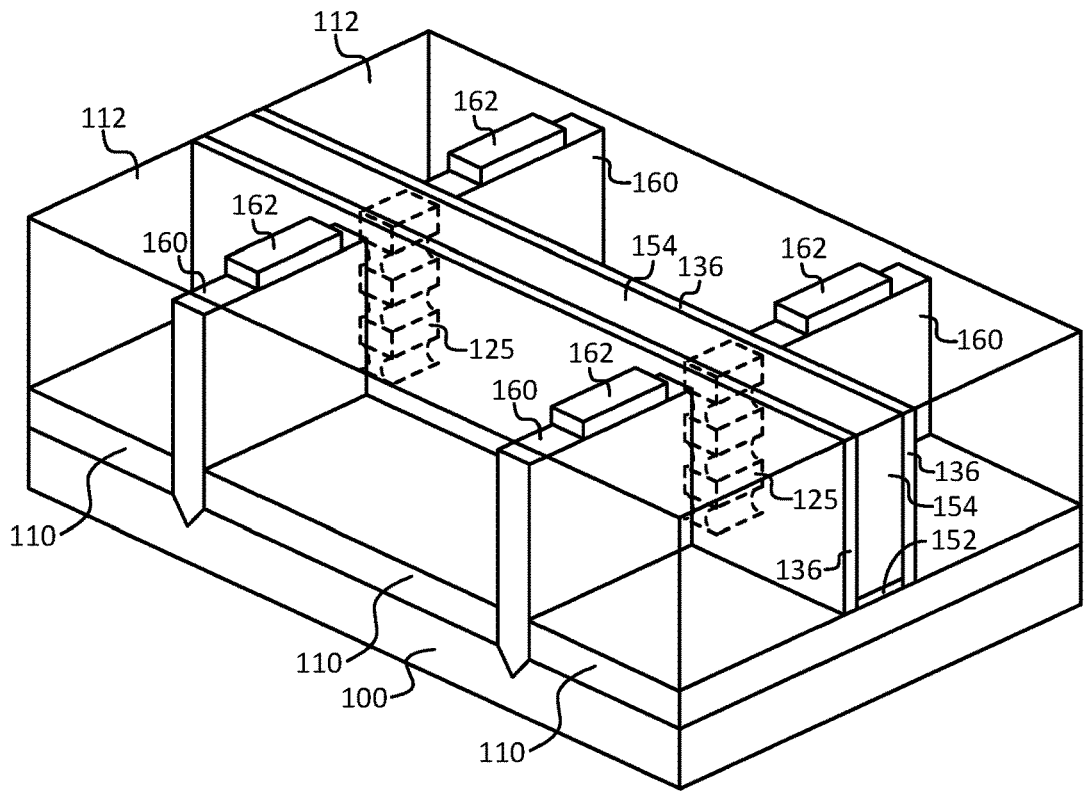
Figure 13:
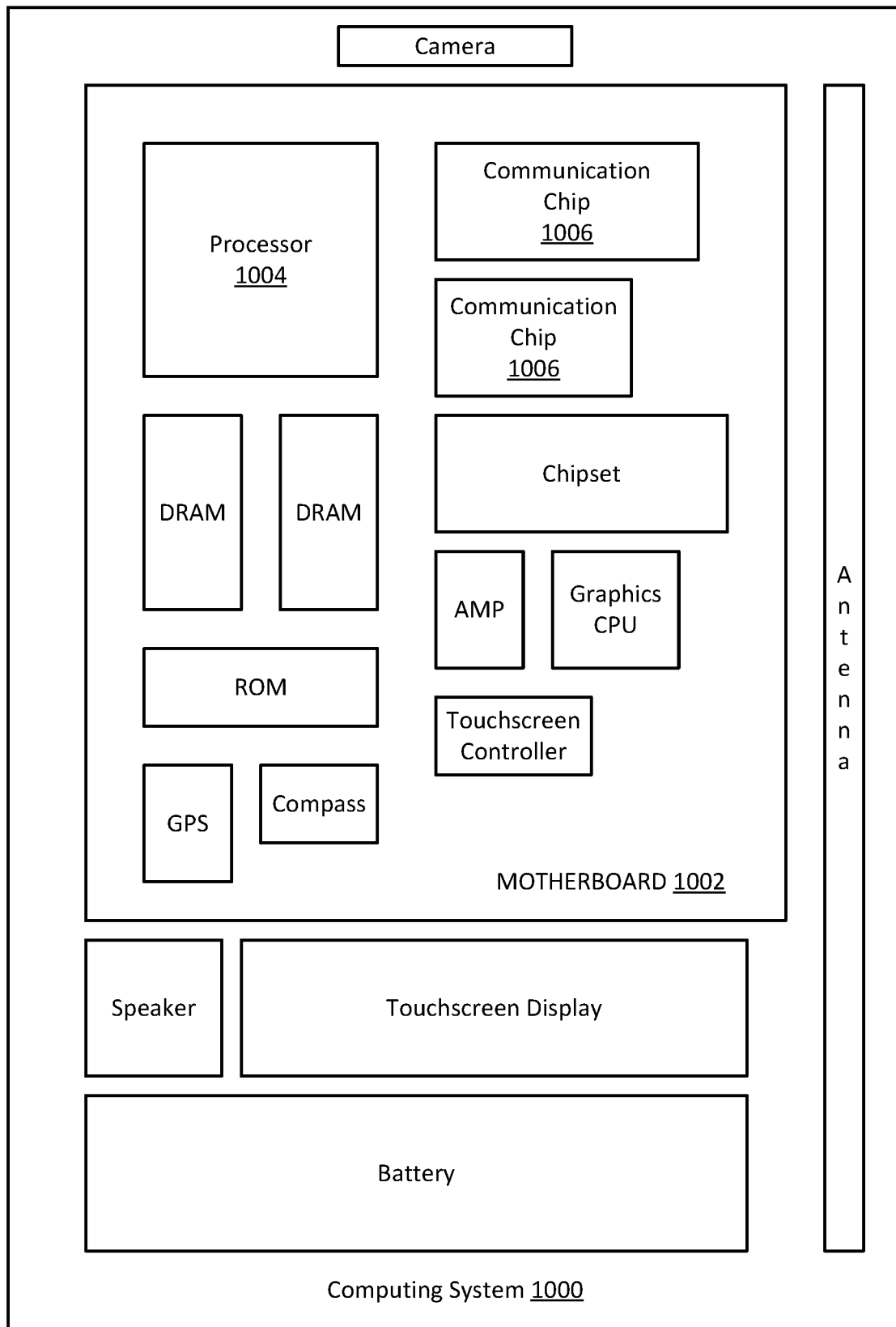
FIG. 13 illustrates a computing system implemented with integrated circuit structures or devices formed using the techniques disclosed herein, in accordance with some embodiments of this disclosure.

FIG. 12 illustrates the example structure of FIG. 8 after the processing of FIGS. 9-11 has been performed and after source/drain (S/D) processing has been performed, in accordance with an embodiment. As shown in FIG. 12, the structure includes S/D regions 160 and S/D contacts 162. S/D regions 160, in some embodiments, may be formed using any suitable techniques, depending on the end use or target application. As shown in the example structure of FIG. 12, S/D regions 160 were formed by removing the material stacks in the S/D regions and replacing the material with S/D material, which may or may not include doping, depending on the end use or target application. However, any suitable techniques may have been used to form S/D regions 160. For example, in some embodiments, the multilayer structures that were present in the S/D region locations (e.g., as shown in FIG. 8) may be kept there and used as the S/D material, which may or may not include additional processing to the multilayer structures. In some embodiments, S/D regions 160 may include any suitable material and any suitable doping scheme, such as being undoped (intrinsic/i-type), n-type doped, or p-type doped using appropriate techniques and materials based on the S/D material and depending on the end use or target application. For example, in an embodiment where beaded fin channel region 125 (illustrated in dashed lines in FIG. 12) includes group IV material and the transistor device is configured to be a PMOS device, S/D regions 160 may both include p-type doped Si (e.g., where boron is the p-type dopant). In another example embodiment, where the beaded fin channel region 125 includes group IV material and the transistor device is configured to be an NMOS device, S/D regions 160 may both include n-type doped Si (e.g., where phosphorus is the n-type dopant). In another example embodiment, where the beaded fin channel region 125 includes III-V material, S/D regions 160 may both include n-type doped InGaAs or InAs (e.g., where Si is the n-type dopant). In some embodiments, S/D regions 160 may have a multi-layer structure including multiple material layers. For instance, in some embodiments, a passivation material may be deposited prior to the deposition of the primary S/D material to assist with the quality of the interface between the S/D material 160 and substrate 100, for example. Further, in some embodiments, a contact-improving material may be formed on the top of the S/D regions 160 to assist with making contact to S/D contacts 160 (e.g., using S/D contacts 162 described below), for instance. In some embodiments, S/D regions 160 may include grading (e.g., increasing and/or decreasing) the content of one or more materials in at least a portion of the regions.

S/D contacts 162, in some embodiments, may be formed using any suitable techniques, depending on the end use or target application. In some embodiments, S/D contacts 162 may include any suitable material, such as a conductive metal or alloy (e.g., aluminum, tungsten, silver, nickel-platinum, or nickel-aluminum). In some embodiments, S/D contacts 162 may include a resistance reducing metal and a contact plug metal, or just a contact plug, depending on the end use or target application. Example contact resistance reducing metals may include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the S/D contacts region 162, such as adhesion layers (e.g., titanium nitride) and/or liner or barrier layers (e.g., tantalum nitride), if so desired. In some embodiments, metallization of the S/D contacts 162 may be carried out, for example, using a silicidation or germanidation process (e.g., generally, deposition of contact metal followed by annealing). Numerous S/D configurations will be apparent in light of this disclosure.

In some embodiments, any suitable additional processing may be performed to form one or more transistors including a beaded fin configuration. Further additional processing that may be performed may include back-end-of-line interconnections, for example. Moreover, any suitable techniques may be used in the formation of a transistor structure including a beaded fin configuration as described herein. For example, in some embodiments, a gate last process flow may be used to form the transistor structure of FIG. 12, where the S/D regions 160 are formed prior to forming the final gate stack (which includes gate dielectric 152 and gate electrode 154, in the example structure of FIG. 12). As can be understood based on this disclosure, in some embodiments, the beaded fin structure may only be present in the channel region (or gate trench region) of transistors including such a beaded fin configuration. As described herein, the techniques may be used to benefit p-type and/or n-type transistor devices including varying suitable materials. Further, the techniques can be applied to benefit various different transistor types, such metal-oxide-semiconductor field-effect transistors (MOSFETs) and tunnel FETs (TFETs), to name a few examples. Further still, the techniques can be applied regardless of the transistor doping schemes used. For example, in the case of a MOSFET configuration, the channel region may be doped in a type opposite from the adjacent S/D regions, such as an n-type MOSFET (NMOS) configuration that includes n-type doped S/D material and p-type doped channel material, or a p-type MOSFET (PMOS) configuration that includes p-type doped S/D material and n-type doped channel material. In the case of a TFET configuration, the S/D regions may be oppositely typed doped (where one is n-type doped and the other is p-type doped) and the channel material may be minimally doped or undoped/intrinsic (i-type). Further note that the techniques can be used to benefit one or both of n-type and p-type transistors included in a complementary device, such as one or both of NMOS and PMOS transistors included in a complementary MOS (CMOS) device, for example. Accordingly, the techniques described herein are not intended to be limited to any particular transistor configuration, unless otherwise stated. Numerous variations and configurations will be apparent in light of this disclosure.

Example System

FIG. 14 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a gate stack including a gate dielectric and a gate electrode; a channel region below and between portions of the gate stack, such that the gate stack is adjacent to multiple sides of the channel region, and source and drain (S/D) regions adjacent to the channel region. The channel region includes: a first layer having a first minimum width between portions of the gate stack; and a second layer in contact with the first layer and having a second minimum width between portions of the gate stack; wherein the first layer includes at least one different material than the second layer, and wherein the first minimum width is less than the second minimum width.

Example 2 includes the subject matter of Example 1, wherein the first minimum width is in the range of 2 to 15 nm.

Example 3 includes the subject matter of any of Examples 1-2, wherein the second minimum width is in the range of 4 to 30 nm.

Example 4 includes the subject matter of any of Examples 1-3, wherein the first minimum width is at least 2 nm less than the second minimum width Example 5 includes the subject matter of any of Examples 1-4, wherein the second minimum width is at least 2 times the first minimum width.

Example 6 includes the subject matter of any of Examples 1-5, wherein at least one of the first and second layers includes group III-V semiconductor material.

Example 7 includes the subject matter of any of Examples 1-6, wherein at least one of the first and second layers includes group IV semiconductor material.

Example 8 includes the subject matter of any of Examples 1-7, wherein material of the first layer has a bandgap of at least 0.3 eV greater than material of the second layer.

Example 9 includes the subject matter of any of Examples 1-7, wherein material of the second layer has a bandgap of at least 0.3 eV greater than material of the first layer.

Example 10 includes the subject matter of any of Examples 1-9, wherein at least one of the first and second layers includes indium gallium arsenide ($In_xGa_{1-x}As$).

Example 11 includes the subject matter of any of Examples 1-10, wherein the first layer includes at least one of indium arsenide (InAs), gallium arsenide (GaAs), and indium phosphide (InP).

Example 12 includes the subject matter of any of Examples 1-11, wherein the first and second layers each include a thickness below the gate stack in the range of 2 to 20 nm.

Example 13 includes the subject matter of any of Examples 1-12, further including a buffer layer below the channel region, the buffer layer providing a buffer between the channel region and a substrate.

Example 14 includes the subject matter of any of Examples 1-13, the channel region further including at least one additional set of the first and second layers in the channel regions, such that the channel region includes at least four layers.

Example 15 includes the subject matter of any of Examples 1-14, the channel region further including a third layer in contact with at least one of the first and second layers and having a third minimum width between portions of the gate stack, wherein the third layer includes at least one different material than the first and second layers, and wherein the third minimum width is less than the second minimum width.

Example 16 includes the subject matter of any of Examples 1-15, wherein the transistor is one of an n-type and p-type transistor.

Example 17 includes the subject matter of any of Examples 1-16, wherein the transistor is one of a metal-oxide-semiconductor field-effect-transistor (MOSFET) and a tunnel field-effect-transistor (TFET).

Example 18 is a computing system including the subject matter of any of Examples 1-17.

Example 19 is a transistor including: a gate stack including a gate dielectric and a gate electrode; spacers adjacent to both sides of the gate stack; a channel region below the gate stack, wherein the gate stack is adjacent to a top and opposing sides of the channel region, such that an active portion of the channel region is between the gate stack, and the active portion of the channel region has a beaded fin configuration that includes: a plurality of first material layers; and a plurality of second material layers, each second material layer in contact with a first material layer; wherein the first material is different from the second material, and wherein each of the first material layers has a minimum width between the gate stack that is less than a minimum width between the gate stack of any of the second material layers; and source and drain (S/D) regions adjacent to the channel region.

Example 20 includes the subject matter of Example 19, wherein the minimum width of each of the first material layers is in the range of 2 to 15 nm.

Example 21 includes the subject matter of any of Examples 19-20, wherein the minimum width of each of the second material layers is in the range of 4 to 30 nm.

Example 22 includes the subject matter of any of Examples 19-21, wherein the minimum width of each of the first material layers is at least 2 nm less than the minimum width of any of the second material layers.

Example 23 includes the subject matter of any of Examples 19-22, wherein the minimum width of each of the first material layers is less than half the minimum width of any of the second material layers.

Example 24 includes the subject matter of any of Examples 19-23, wherein at least one of the first and second materials includes group III-V semiconductor material.

Example 25 includes the subject matter of any of Examples 19-24, wherein at least one of the first and second materials includes group IV semiconductor material.

Example 26 includes the subject matter of any of Examples 19-25, wherein the first material has a bandgap of at least 0.3 eV greater than the second material.

Example 27 includes the subject matter of any of Examples 19-25, wherein the second material has a bandgap of at least 0.3 eV greater than the first material.

Example 28 includes the subject matter of any of Examples 19-27, wherein at least one of the first and second materials includes indium gallium arsenide ($In_xGa_{1-x}As$).

Example 29 includes the subject matter of any of Examples 19-28, wherein the first material includes at least one of indium arsenide (InAs), gallium arsenide (GaAs), and indium phosphide (InP).

Example 30 includes the subject matter of any of Examples 19-29, wherein each of the first and second material layers include a thickness below the gate stack in the range of 2 to 20 nm.

Example 31 includes the subject matter of any of Examples 19-30, further including a buffer layer below the active portion of the channel region, the buffer layer providing a buffer between the active portion of the channel region and a substrate.

Example 32 includes the subject matter of any of Examples 19-31, wherein the active portion of the channel region includes at least three layers of at least one of the first and second material layers.

Example 33 includes the subject matter of any of Examples 19-32, the active portion of the channel region further including a third material layer in contact with at least one of the first and second material layers, the third material different from the first and second materials, wherein the third material layer has a minimum width between the gate stack that is less than a minimum width between the gate stack of any of the second material layers.

Example 34 includes the subject matter of any of Examples 19-33, wherein the transistor is one of an n-type and p-type transistor.

Example 35 includes the subject matter of any of Examples 19-34, wherein the transistor is one of a metal-oxide-semiconductor field-effect-transistor (MOSFET) and a tunnel field-effect-transistor (TFET).

Example 36 is a computing system including the subject matter of any of Examples 19-35.

Example 37 is a method of forming a transistor, the method including: forming a multilayer fin including a first layer and a second layer in contact with the first layer, wherein the first layer includes at least one different material than the second layer; performing a selective etch process to remove material from the first layer and cause at least a portion of the first layer to narrow, thereby forming a beaded fin structure, wherein the selective etch process removes material from the first layer at least twice as fast as the selective etch process removes material from the second layer; forming a gate stack above the beaded fin structure, the gate stack including a gate dielectric and a gate electrode, wherein the gate stack is adjacent to a top and opposing sides of the beaded fin structure such that the beaded fin structure is between the gate stack, and wherein the gate dielectric is between the gate electrode and the beaded fin structure; and forming source and drain (S/D) regions adjacent to the beaded fin structure.

Example 38 includes the subject matter of Example 37, wherein forming the multilayer fin is performed using an aspect ratio trapping (ART) scheme.

Example 39 includes the subject matter of any of Examples 37-38, wherein the selective etch process removes material from the first layer at least five times as fast as the selective etch process removes material from the second layer.

Example 40 includes the subject matter of any of Examples 37-39, further including forming a buffer layer below the multilayer fin, the buffer layer providing a buffer between the multilayer fin and a substrate.

Example 41 includes the subject matter of any of Examples 37-40, wherein the multilayer fin includes at least one additional set of the first and second layers, such that the multilayer fin includes at least four layers.

Example 42 includes the subject matter of Example 41, wherein the selective etch process removes material from each of the first layers and causes at least a portion of each of the first layers to narrow.

Example 43 includes the subject matter of any of Examples 37-42, wherein the multilayer fin includes a third layer in contact with at least one of the first and second layers, the third layer including at least one different material than the first and second layers.

Example 44 includes the subject matter of Example 43, further including performing another selective etch process to remove material from the third layer and cause at least a portion of the third layer to narrow, wherein the other selective etch process removes material from the third layer at a faster rate than it removes material from the first and second layers.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
   a gate structure including a gate dielectric and a gate electrode; and
   a fin below the gate structure, the fin also between portions of the gate structure, the fin including
      a first layer including a first semiconductor material, the first layer having upper, middle, and lower sections that form a continuous portion of the first layer that is between the portions of the gate structure, with the middle section below the upper section and above the lower section, wherein a smallest horizontal width of the middle section is at least 2 nanometers (nm) less than each of (i) a smallest horizontal width of the upper section and (ii) a smallest horizontal width of the lower section, and
      a second layer in contact with the first layer, the second layer including a second semiconductor material compositionally different from the first semiconductor material, the second layer having a horizontal width that is higher than the smallest horizontal width of the middle section of the first layer.

2. The integrated circuit of claim 1, wherein the smallest horizontal width of the middle section is in the range of 2 to 15 nanometers.

3. The integrated circuit of claim 1, wherein the horizontal width of the second layer is in the range of 4 to 30 nanometers.

4. The integrated circuit of claim 1, wherein the smallest horizontal width of the middle section is at least 2 nanometers less than the horizontal width of the second layer.

5. The integrated circuit of claim 1, wherein the horizontal width of the second layer is at least 2 times the smallest horizontal width of the middle section.

6. The integrated circuit of claim 1, wherein at least one of the first or second layers includes group III-V semiconductor material.

7. The integrated circuit of claim 1, wherein at least one of the first or second layers includes group IV semiconductor material.

8. The integrated circuit of claim 1, wherein the first semiconductor material has a bandgap of at least 0.3 electron volts (eV) greater than the second semiconductor material.

9. The integrated circuit of claim 1, wherein the second semiconductor material has a bandgap of at least 0.3 electron volts (eV) greater than the first semiconductor material.

10. The integrated circuit of claim 1, wherein the second semiconductor material includes indium, gallium, and arsenic.

11. The integrated circuit of claim 1, wherein the first semiconductor material includes arsenic and one of indium or gallium.

12. The integrated circuit of claim 1, wherein the first and second layers each include a vertical thickness in the range of 2 to 20 nanometers.

13. The integrated circuit of claim 1, further comprising a third layer below the fin, the third layer including a third semiconductor material compositionally different from both of the first and second semiconductor materials.

14. The integrated circuit of claim 1, further comprising a source region and a drain region, at least a portion of the fin between the source and drain regions.

15. A computing system comprising the integrated circuit of claim 1.

16. An integrated circuit including at least one transistor, the integrated circuit comprising:
   a gate structure including a gate dielectric and a gate electrode; and
   a fin below the gate structure, the fin also between portions of the gate structure, the fin including
      a first layer including a first semiconductor material, the first layer having upper, middle, and lower sections, with the middle section between the upper and lower sections, wherein a minimum horizontal width of the middle section is less than each of (i) a minimum horizontal width of the upper section and (ii) a minimum horizontal width of the lower section,
      a second layer in contact with the first layer, the second layer including a second semiconductor material compositionally different from the first semiconductor material, the second layer having a minimum horizontal width that is at least 2 nanometers (nm) higher than the minimum horizontal width of the middle section,
      a third layer in contact with the second layer, the third layer including the first semiconductor material, the third layer having a minimum horizontal width that is less than the minimum horizontal width of the second layer, and
      a fourth layer in contact with the third layer, the fourth layer including the second semiconductor material.

17. The integrated circuit of claim 16, wherein the minimum horizontal widths of the middle section and the third layer are in the range of 2 to 15 nanometers, and wherein the minimum horizontal width of the second layer is in the range of 4 to 30 nanometers.

18. The integrated circuit of claim 16, wherein the first semiconductor material includes arsenic and one of indium or gallium, and the second semiconductor material includes indium, gallium, and arsenic.

19. An integrated circuit including at least one transistor, the integrated circuit comprising:
   a gate structure including a gate dielectric and a gate electrode; and
   a fin below the gate structure and also at least in part between portions of the gate structure, the fin including
      a first layer including a first semiconductor material, the first layer having a first horizontal width,
      a second layer underneath the first layer, the second layer including a second semiconductor material compositionally different from the first semiconductor material, the second layer having a second minimum horizontal width, the second minimum horizontal width less than the first horizontal width by at least 2 nanometers (nm),
      a third layer underneath the second layer, the third layer including the first semiconductor material of the first layer, and
      a fourth layer directly underneath the third layer and compositionally different from the third layer, wherein a horizontal width of each of the third and fourth layers are at least 2 nm greater than the second minimum horizontal width of the second layer.

20. The integrated circuit of claim 19, wherein at least a section of the fourth layer is between portions of an insulation material.

* * * * *